(12) United States Patent
Wiberg et al.

(10) Patent No.: US 12,132,500 B2
(45) Date of Patent: Oct. 29, 2024

(54) ACCELERATING BIT ERROR CORRECTION IN A RECEIVER

(71) Applicant: Telefonaktiebolaget LM Ericsson (publ), Stockholm (SE)

(72) Inventors: Niclas Wiberg, Linköping (SE); Martin Hessler, Linköping (SE)

(73) Assignee: Telefonaktiebolaget LM Ericsson (Publ), Stockholm (SE)

(*) Notice: Subject to any disclaimer, the term of this patent is extended or adjusted under 35 U.S.C. 154(b) by 62 days.

(21) Appl. No.: 17/909,896

(22) PCT Filed: Mar. 3, 2021

(86) PCT No.: PCT/EP2021/055282
§ 371 (c)(1),
(2) Date: Sep. 7, 2022

(87) PCT Pub. No.: WO2021/190887
PCT Pub. Date: Sep. 30, 2021

(65) Prior Publication Data
US 2023/0101789 A1 Mar. 30, 2023

Related U.S. Application Data

(60) Provisional application No. 62/993,210, filed on Mar. 23, 2020.

(51) Int. Cl.
H03M 13/11 (2006.01)
(52) U.S. Cl.
CPC .... H03M 13/1188 (2013.01); H03M 13/1111 (2013.01); H03M 13/1137 (2013.01)
(58) Field of Classification Search
CPC .......... H03M 13/1188; H03M 13/1111; H03M 13/1137; H03M 13/114; H03M 13/116
(Continued)

(56) References Cited

U.S. PATENT DOCUMENTS 9,590,658 B1 * 3/2017 Zeng ................. H03M 13/1122
11,075,650 B1 * 7/2021 Dow ................. H03M 13/1182
(Continued)

FOREIGN PATENT DOCUMENTS

EP 1622276 A2 2/2006
WO 2018128560 A1 7/2018

OTHER PUBLICATIONS

International Search Report and Written Opinion dated Jun. 4, 2021 for International Application No. PCT/EP2021/055282 filed Mar. 3, 2021; consisting of 14 pages.
(Continued)

Primary Examiner — Albert Decady
Assistant Examiner — Osman M Alshack
(74) Attorney, Agent, or Firm — Weisberg I.P. Law, P.A.

(57) ABSTRACT

A method for accelerating bit error correction in a receiver in a radio communication network, wherein the receiver is configured to update soft bit values associated with each code bit of a block code based on parallel parity checks. The method includes receiving a block code encoded message, and for any group of two or more rows of a parity-check matrix of the block code: when the two or more rows are non-overlapping: combining the two or more rows in a row group for parallel updating, updating, in parallel, the parity checks of the row group for the received message, and forming a message estimate based on the updated parity checks. Corresponding computer program product, apparatus, and receiver are also disclosed.

18 Claims, 20 Drawing Sheets

(58) Field of Classification Search
USPC .......................................... 714/752, 758, 776
See application file for complete search history.

(56) References Cited

U.S. PATENT DOCUMENTS

| | | | | |
|---|---|---|---|---|
| 2007/0089017 A1* | 4/2007 | Tang | .................. | H03M 13/1131 714/752 |
| 2007/0089018 A1* | 4/2007 | Tang | .................. | H03M 13/1122 714/752 |
| 2007/0283220 A1* | 12/2007 | Kim | .................. | H03M 13/1148 714/758 |
| 2008/0126916 A1* | 5/2008 | Chung | ................ | H03M 13/116 714/801 |
| 2011/0161770 A1* | 6/2011 | Ueng | ................... | H03M 13/13 714/752 |
| 2011/0179333 A1* | 7/2011 | Wesel | ................ | H03M 13/1111 714/752 |
| 2011/0283158 A1 | 11/2011 | Yang et al. | | |
| 2017/0317692 A1 | 11/2017 | Anderson | | |
| 2018/0026662 A1* | 1/2018 | Kang | ................ | H03M 13/3738 714/776 |
| 2018/0226992 A1* | 8/2018 | Panteleev | ........... | H03M 13/616 |
| 2021/0194509 A1* | 6/2021 | Cirkic | .................. | H04L 1/0045 |

OTHER PUBLICATIONS

3GPP TSG-RAN WG1 NR R1-1701211; Title: High Efficiency LDPC code Features; Agenda item: 5.1.5.1; Source: MediaTek Inc.; Document for: Discussion/Decision; Date and Location: Jan. 16-20, 2017, Spokane, Washington; consisting of 13 pages.
3GPP TS 38.212 V16.0.0; 3rd Generation Partnership Project; Technical Specification Group Radio Access Network; NR; Multiplexing and channel coding (Release 16); Dec. 2019; consisting 145 pages.
Swedish Office Action dated Apr. 7, 2021 for Swedish Patent Application No. 2030161-0; consisting of 8 pages.
Gallager, R.G.; Low-Density Parity-Check Codes; IRE Transactions on Information Theory; Jan. 1962; pp. 21-28; Cambridge, Massachusetts; consisting of 8 pages.

* cited by examiner

ACCELERATING BIT ERROR CORRECTION IN A RECEIVER

CROSS-REFERENCE TO RELATED APPLICATIONS

This application is a Submission Under 35 U.S.C. § 371 for U.S. National Stage Patent Application of International Application No.: PCT/EP2021/055282, filed Mar. 3, 2021 entitled "ACCELERATING BIT ERROR CORRECTION IN A RECEIVER," which claims priority to U.S. Provisional Application No. 62/993,210, filed Mar. 23, 2020, entitled "ACCELERATING BIT ERROR CORRECTION IN A RECEIVER," the entireties of both of which are incorporated herein by reference.

TECHNICAL FIELD

The present disclosure relates generally to the field of bit error correction. More particularly, it relates to accelerating bit error correction in a receiver in a radio communication network.

BACKGROUND

Low-Density Parity-Check (LDPC) codes are used, e.g., in the 5G NR communication standard to allow a receiver to correct bit errors that occur during radio transmission.

A first drawback of the use of LPDC codes is that updating of parity checks may require processing of one row of a parity-check matrix at a time, e.g. from top to bottom, and render increased processing time.

A second drawback of the use of LPDC codes is that updating of parity checks may require processing of all rows of a parity-check matrix at a time, i.e. in parallel, and render increased hardware size.

A third drawback of the use of LPDC codes is that in a parallel approach, many row updates may update soft bit values for the same bits and render expensive synchronization to avoid race conditions as well as more iterations to be performed.

Therefore, there is a need for alternative approaches for accelerating bit error correction in a receiver in a radio communication network.

SUMMARY

It should be emphasized that the term "comprises/comprising" when used in this specification is taken to specify the presence of stated features, integers, steps, or components, but does not preclude the presence or addition of one or more other features, integers, steps, components, or groups thereof. As used herein, the singular forms "a", "an" and "the" are intended to include the plural forms as well, unless the context clearly indicates otherwise.

Generally, when an apparatus is referred to herein, it is to be understood as a physical product. The physical product may comprise one or more parts, such as controlling circuitry in the form of one or more controllers, one or more processors, or the like.

It is an object of some embodiments to solve or mitigate, alleviate, or eliminate at least some of the above or other drawbacks.

According to a first aspect, this is achieved by a method for accelerating bit error correction in a receiver in a radio communication network, wherein the receiver is configured to update soft bit values associated with each code bit of a block code based on parallel parity checks.

The method comprises receiving a block code encoded message.

The method further comprises for any group of two or more rows of a parity-check matrix of the block code: when the two or more rows are non-overlapping: combining the two or more rows in a row group for parallel updating; and updating, in parallel, the parity checks of the row group for the received message.

The method furthermore comprises forming a message estimate based on the updated parity checks.

In some embodiments the method further comprises when the two or more rows are overlapping in one shared bit: combining the two or more rows in a row group for parallel updating; and updating the parity checks of the row group for the received message.

In some embodiments, the updating of the parity checks of the row group for the received message is performed by: collecting available bit-to-check values except from the shared bit; computing shared check-to-bit values towards the shared bit based on the collected bit-to-check values; computing shared bit-to-check values for the shared bit based on the computed shared check-to-bit values; computing new check-to-bit values for all remaining bits; and updating, in parallel, the parity checks of the row group for the received message based on the computed check-to-bit values.

In some embodiments, the receiver is configured to iteratively update soft bit values associated with each code bit of the block code based on parallel parity checks.

In some embodiments, the soft bit values are indicative of corresponding message bits being either zero or one.

In some embodiments, a positive soft bit value is indicative of the corresponding message bit likely being a zero.

In some embodiments, a negative soft value is indicative of the corresponding message bit likely being a one.

In some embodiments, the parity-check matrix is precomputed and stored in a memory of the receiver and/or in a remote memory accessible to the receiver.

In some embodiments, the parity-check matrix is a binary matrix.

A second aspect is a computer program product comprising a non-transitory computer readable medium, having thereon a computer program comprising program instructions. The computer program is loadable into a data processing unit and configured to cause execution of the method according to the first aspect when the computer program is run by the data processing unit.

A third aspect is an apparatus for accelerating bit error correction in a receiver in a radio communication network, wherein the receiver is configured to update soft bit values associated with each code bit of a block code based on parallel parity checks.

The apparatus comprises a controller being configured to cause reception of a block code encoded message.

The controller being further configured to cause for any group of two or more rows of a parity-check matrix of the block code: when the two or more rows are non-overlapping: combination of the two or more rows in a row group for parallel updating; and parallel update of the parity checks of the row group for the received message.

The controller being furthermore configured to cause formation of a message estimate based on the updated parity checks.

In some embodiments, the controller is further configured to cause, when the two or more rows are overlapping in one shared bit: combination of the two or more rows in a row group for parallel updating; and update of the parity checks of the row group for the received message.

In some embodiments, the update of the parity checks of the row group for the received message is caused by: collection of available bit-to-check values except from the shared bit; computation of shared check-to-bit values towards the shared bit based on the collected bit-to-check values; computation of shared bit-to-check values for the shared bit based on the computed shared check-to-bit values; computation of new check-to-bit values for all remaining bits; and parallel update of the parity checks of the row group for the received message based on the computed check-to-bit values.

In some embodiments, the receiver is configured to iteratively update soft bit values associated with each code bit of the block code based on parallel parity checks.

In some embodiments, the apparatus is operably connectable to general-purpose hardware with parallel processing elements configured to process the parallelized parity checks.

In some embodiments, each of the parallel processing elements is configured to compute respective one or more of shared check-to-bit values, shared bit-to-check values, and new check-to-bit values.

In some embodiments, the general-purpose hardware with parallel processing elements is comprised in the receiver and/or in a cloud environment.

In some embodiments, the general-purpose hardware comprises a Graphics Processing Unit, GPU.

A fourth aspect is a receiver in a radio communication network comprising the apparatus according to the third aspect.

In some embodiments, the receiver is configured to update soft bit values associated with each code block bit of a code block based on parallel parity checks.

Any of the above aspects may additionally have features identical with or corresponding to any of the various features as explained above for any of the other aspects.

An advantage of some embodiments is that alternative approaches for accelerating bit error correction in a receiver in a radio communication network are provided.

An advantage of some embodiments is that simultaneous updating of grouped rows allows for a larger degree of parallelization, and thereby provision of shorter processing times compared to what is possible according to prior art approaches on hardware with a plurality of processing units.

Yet an advantage of some embodiments is that grouped rows reduces the number of sequential steps and thereby the number of times that different processing units are required to synchronize and exchange information.

Yet an advantage of some embodiments is that grouped rows allows for more information to be processed in each step compared to what is possible according to prior art approaches and thereby reducing the number of required iterations.

It should be noted that, even if embodiments are described herein in the context of accelerating bit error correction in a receiver in a radio communication network, some embodiments may be equally applicable and/or beneficial also in other contexts.

BRIEF DESCRIPTION OF THE DRAWINGS

Further objects, features and advantages will appear from the following detailed description of embodiments, with reference being made to the accompanying drawings. The drawings are not necessarily to scale, emphasis instead being placed upon illustrating the example embodiments.

FIG. 3a is a schematic drawing illustrating an example base graph matrix according to some embodiments;

FIG. 3b is a schematic drawing illustrating an example parity-check matrix according to some embodiments;

DETAILED DESCRIPTION

Figure 1:
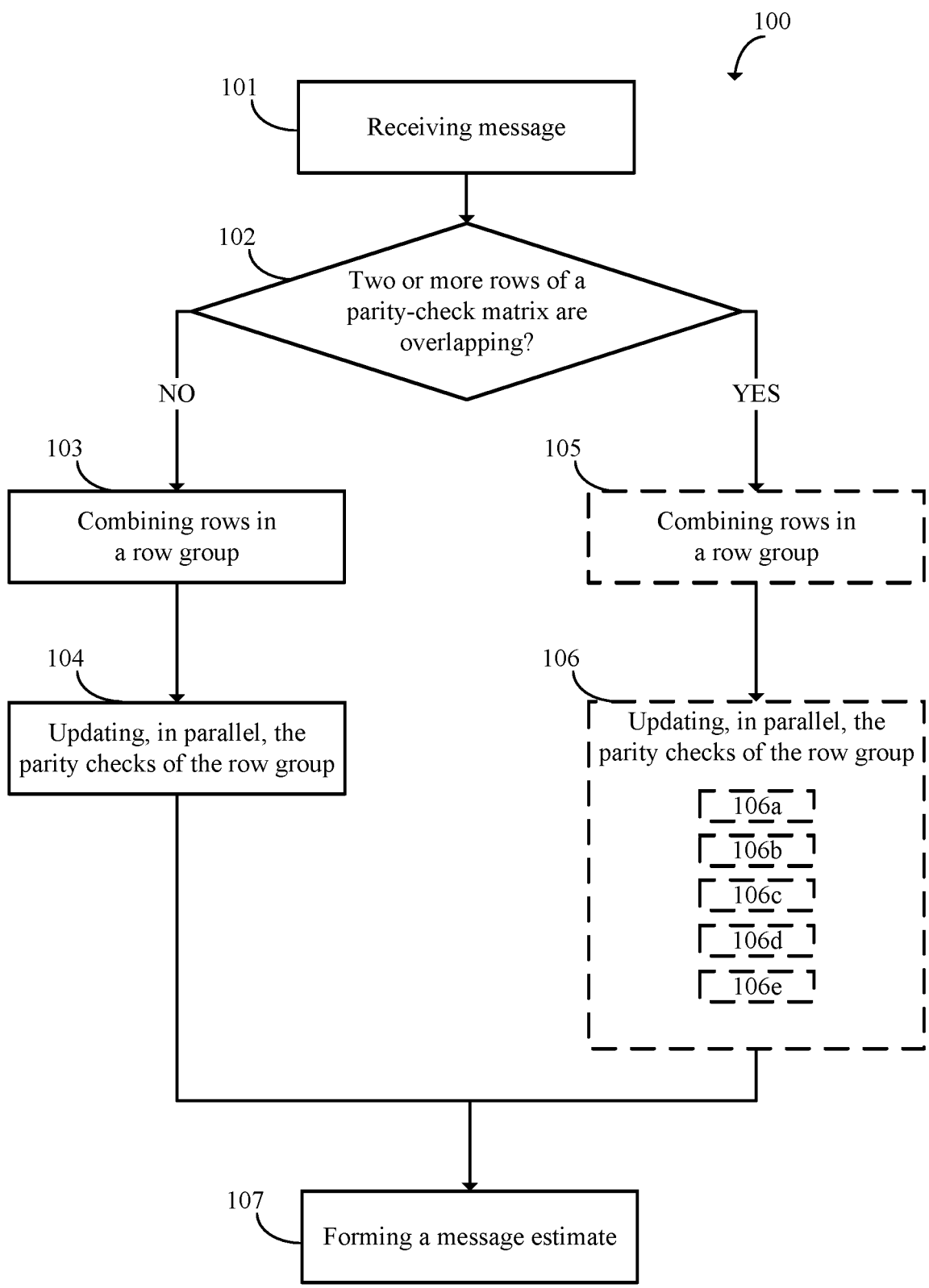
FIG. 1 is a flowchart illustrating example method steps according to some embodiments.

As already mentioned above, it should be emphasized that the term "comprises/comprising" when used in this specification is taken to specify the presence of stated features, integers, steps, or components, but does not preclude the presence or addition of one or more other features, integers, steps, components, or groups thereof. As used herein, the singular forms "a", "an" and "the" are intended to include the plural forms as well, unless the context clearly indicates otherwise.

Embodiments of the present disclosure will be described and exemplified more fully hereinafter with reference to the accompanying drawings. The solutions disclosed herein can, however, be realized in many different forms and should not be construed as being limited to the embodiments set forth herein.

As mentioned above, LDPC codes are used, e.g., in the 5G NR (Fifth Generation New Radio) communication standard to allow a receiver to correct bit errors that occur during radio transmission.

An LDPC code is defined by a binary matrix of size R×N, where R is the number of redundancy bits and N is the total number of bits in a code block. In the 5G NR standard, N typically ranges from 28 bits to 26112 bits. Each matrix row represents a parity check that acts upon a subset of the code block bits and requires that these bits have even parity, i.e. that their modulo-2 sum is zero.

The parity checks are defined by the location of the non-zero entries of the parity-check matrix. The parity checks are relatively small, in that each involve a relatively small subset of the code block bits. In the 5G NR standard, the parity-check sizes typically range from 3 to 19 bits.

In the following, embodiments will be presented where alternative approaches for accelerating bit error correction in a receiver in a radio communication network are described.

Bit error correction, as described herein, typically comprises detection and correction of errors that occur during radio transmission, wherein additional bits are added to data bits at the time of transmission, wherein the additional bits are called parity bits and allow the detection and correction of the errors. The data bits along with the parity bits form a code word.

A receiver, as described herein, typically comprises a radio receiver configured to receive radio waves and convert information carried by the radio waves into a usable form, wherein the receiver is used with an antenna.

Parallelization, as described herein, typically comprises updating of two or more parity checks of a row group simultaneously in general-purpose hardware comprising one or more processing units.

Synchronization, as described herein, typically comprises synchronization and exchange of information between processing units and/or between processing elements of processing units of general-purpose hardware.

General-purpose hardware, as described herein, typically comprises hardware comprising one or more processing elements associated with shared memory of one or more processing units, wherein the one or more processing elements are configured to process parallelized updating of two or more parity checks of a row group.

Bit-to-check values, as described herein, typically comprises soft information comprising soft bit values associated with each code bit of a block code.

Check-to-bit values, as described herein, typically comprises soft information comprising soft bit values associated with edges of a base graph corresponding to a parity-check matrix.

Shared bit, as described herein, typically comprises logic which is shared for parallelized processes, e.g. processes related to updating of two or more parity checks of a row group.

Parity checks, as described herein, typically comprises one or more parity-check codes represented by one or more parity-check matrices, in which there is one row for each parity group and each column corresponds to a functional output or a check bit.

It should be noted that, even if embodiments are described herein in the context of accelerating bit error correction in a receiver in a radio communication network, wherein the receiver is configured to update soft bit values associated with each code bit of a block code based on parallel parity checks, some embodiments may be equally applicable and/or beneficial also in other contexts wherein bit error correction in a receiver in a radio communication network is accelerated by parallel parity checks.

FIG. 1 is a flowchart illustrating method steps of an example method 100 according to some embodiments. The method 100 is for accelerating bit error correction in a receiver in a radio communication network. Thus, the method 100 may, for example, be performed by the apparatus 1000 and/or the controller 1010 of FIG. 10; all of which will be described later herein.

The method 100 comprises the following steps.

In step 101, a block code encoded message is received.

In step 102, it is determined, for any group of two or more rows of a parity-check matrix of the block code, when the two or more rows are non-overlapping (NO-path out of step 102, proceed to step 103) or when the two or more rows are overlapping in one shared bit (YES-path out of step 102, proceed to step 105).

In step 103, the two or more rows in a row group are combined for parallel updating (NO-path out of step 102).

Figure 6A:
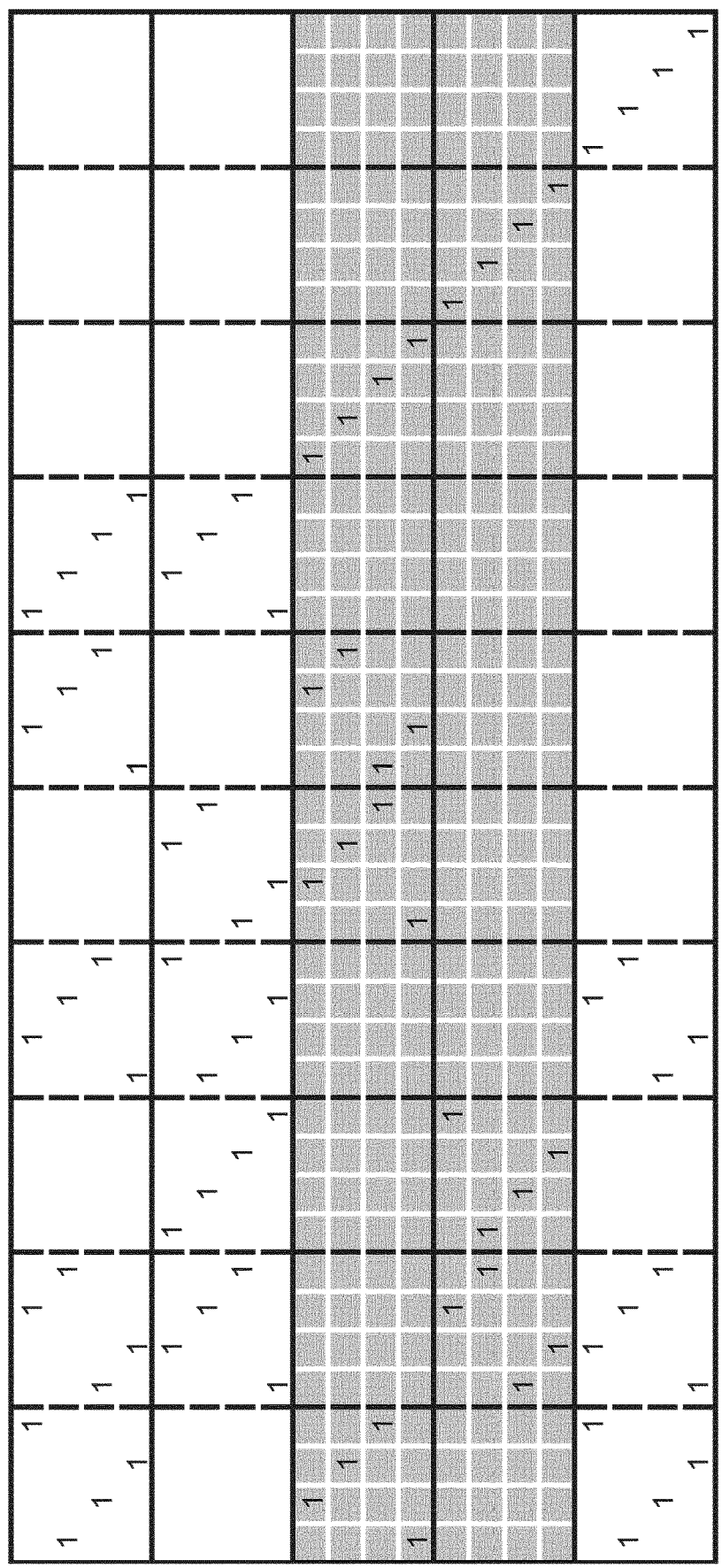
FIG. 6a is a schematic drawing illustrating an example parity-check matrix according to some embodiments.
Figure 6B:
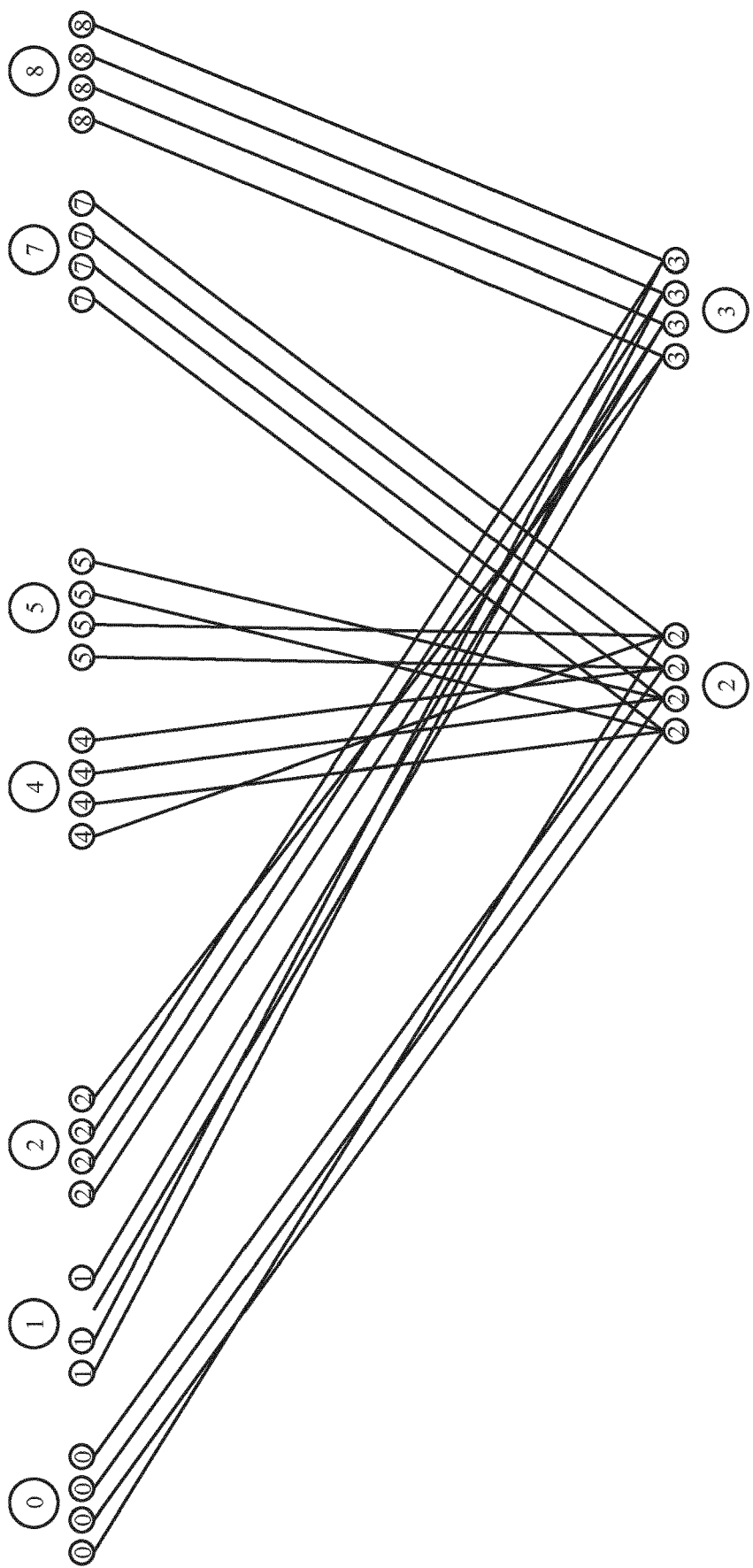
FIG. 6b is a schematic drawing illustrating an example base graph according to some embodiments.

For example, the combination of the two or more rows in the row group may comprise row blocks which are independent from each other, i.e. non-overlapping (reference to FIGS. 6a-b).

In step 104, the parity checks of the row group for the received message are updated in parallel.

Alternatively or additionally, the updating of the parity checks takes place over all of the parity checks in parallel.

In optional step 105, in some embodiments, the two or more rows in a row group are combined for parallel updating (YES-path out of step 102).

Figure 7A:
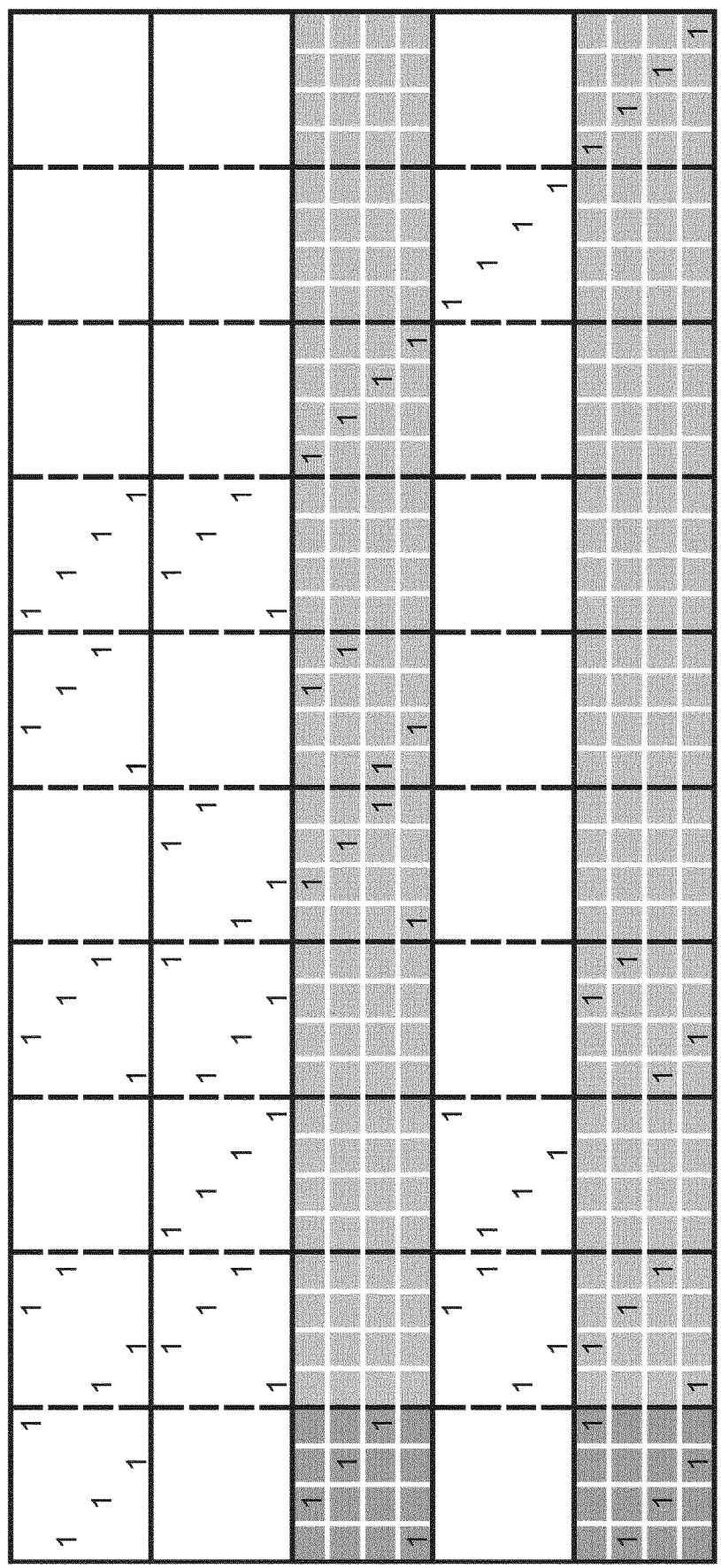
FIG. 7a is a schematic drawing illustrating an example parity-check matrix according to some embodiments.
Figure 7B:
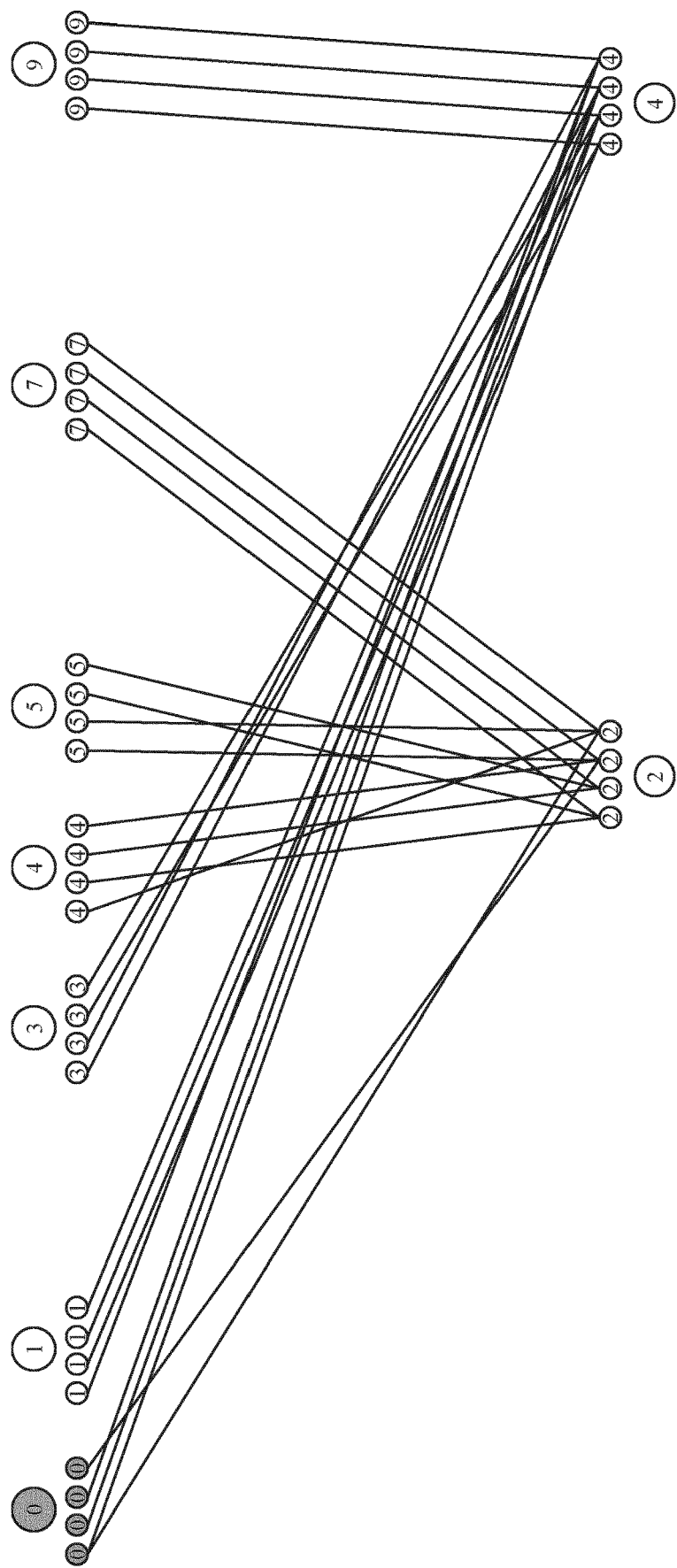
FIG. 7b is a schematic drawing illustrating an example base graph according to some embodiments.
Figure 8A:
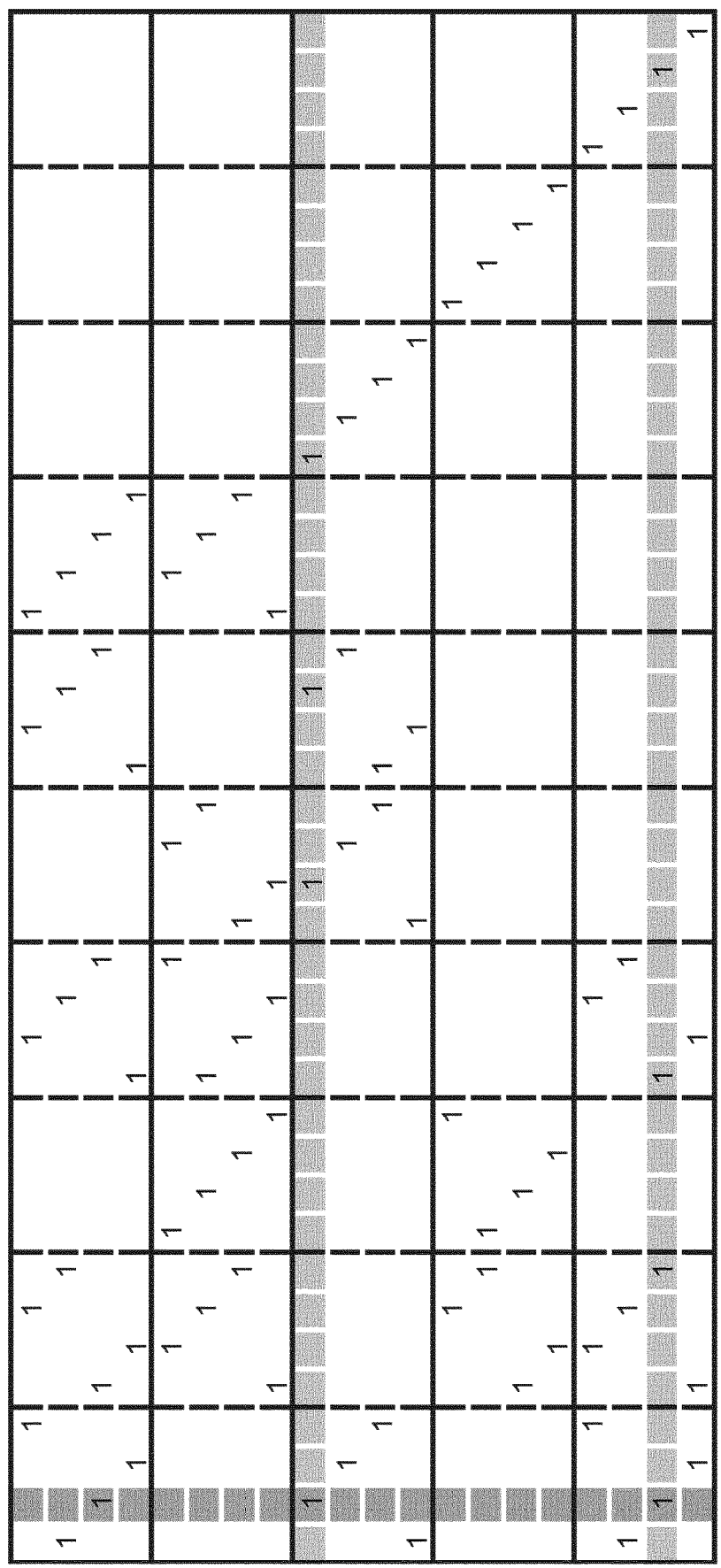
FIG. 8a is a schematic drawing illustrating an example parity-check matrix according to some embodiments.
Figure 8B:
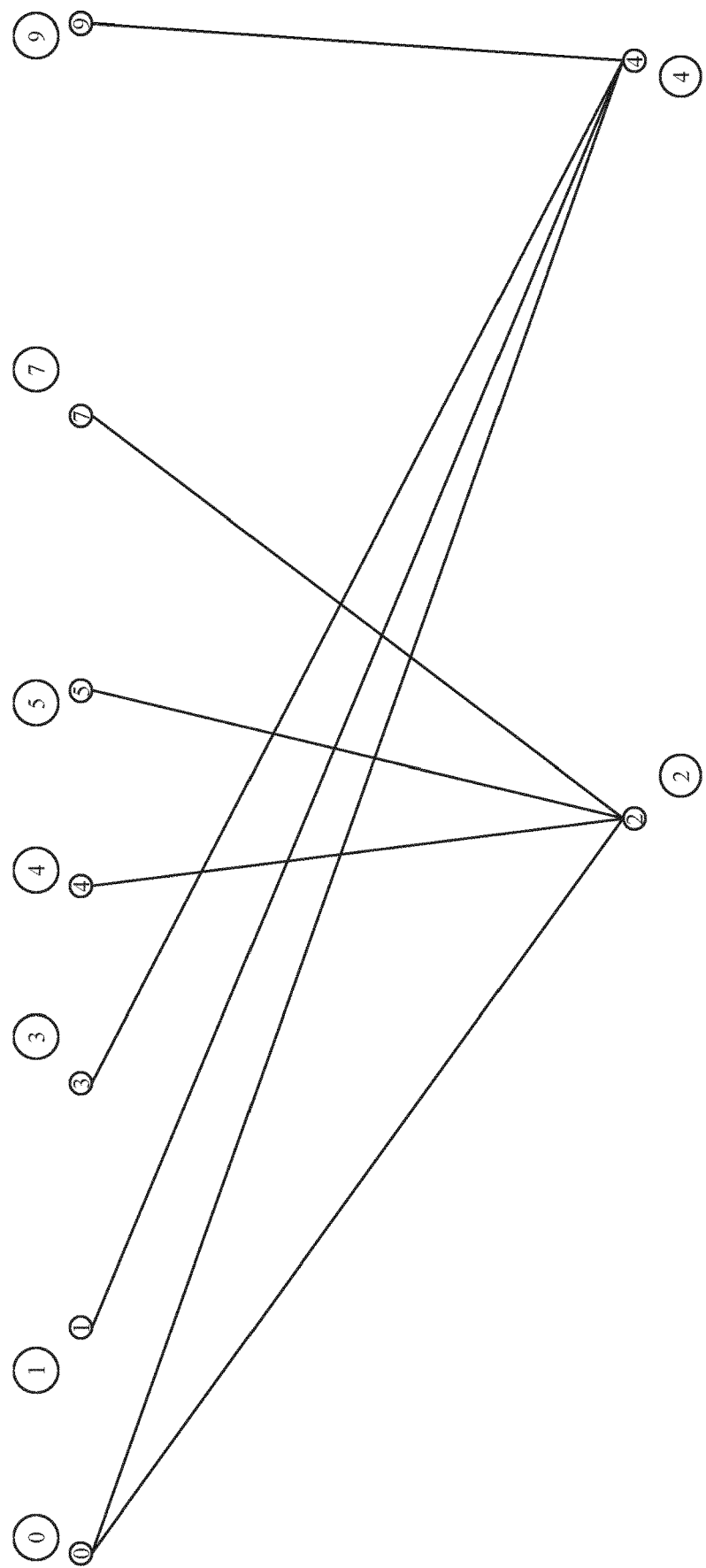
FIG. 8b is a schematic drawing illustrating an example base graph according to some embodiments.

For example, the combination of the two or more rows in the row group may comprise row blocks which overlap in a single column (reference to FIGS. 7a-7b and/or FIG. 8a-8b).

In optional step 106, in some embodiments, the parity checks of the row group for the received message are updated by performing optional steps 106a-106e.

Alternatively or additionally, the updating of the parity checks takes place over all of the parity checks in parallel.

Figure 9A:
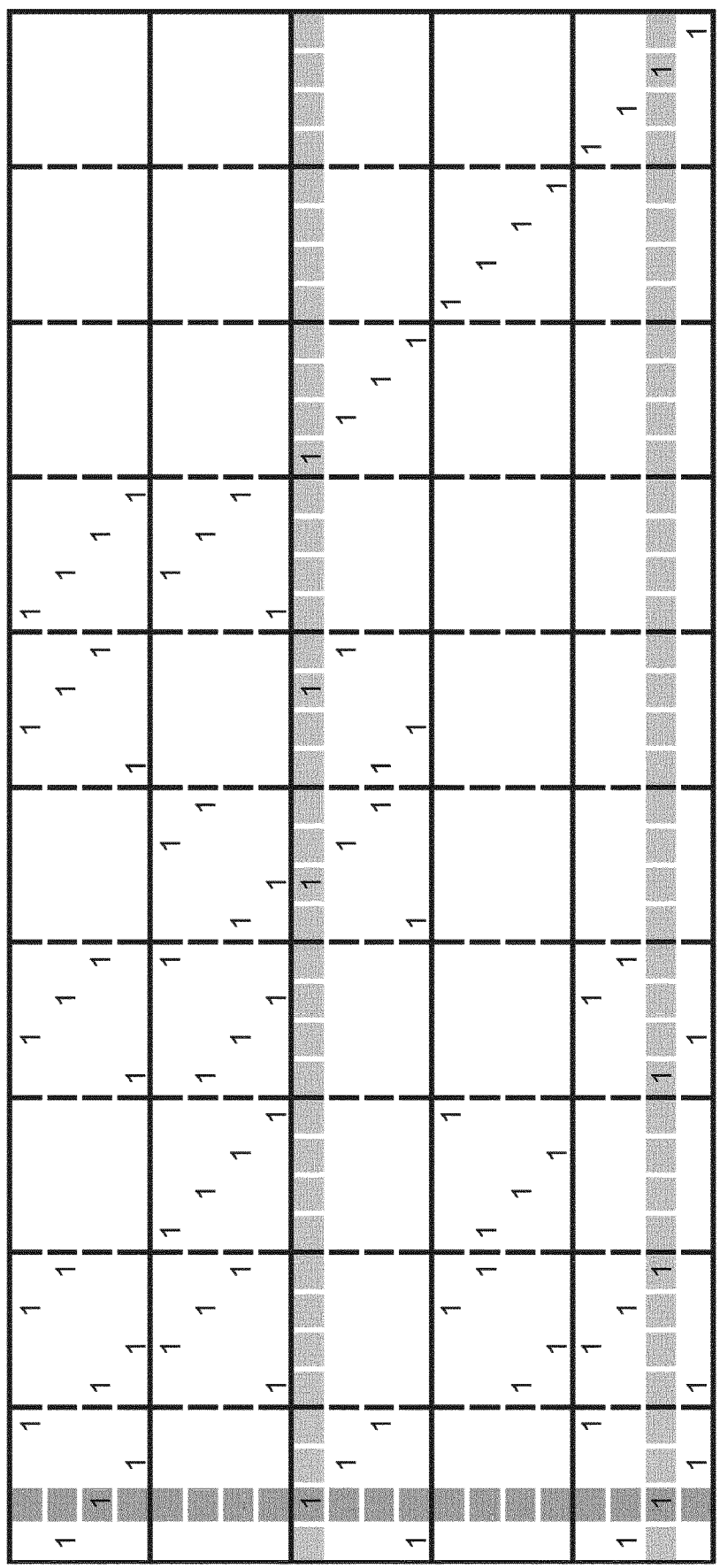
FIG. 9a is a schematic drawing illustrating an example parity-check matrix according to some embodiments.
Figure 9B:
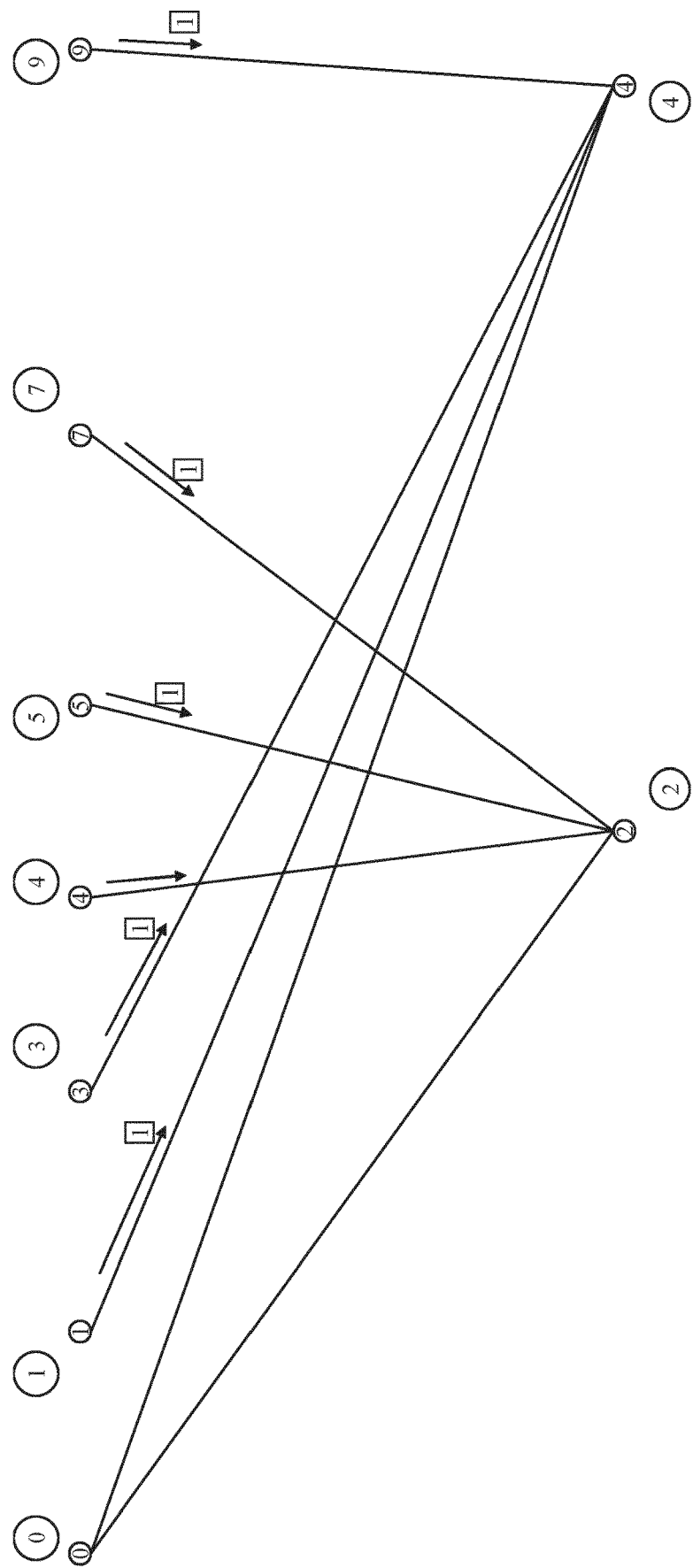
FIG. 9b is a schematic drawing illustrating an example base graph according to some embodiments.

In optional step 106a, in some embodiments, available bit-to-check values are collected except from the shared bit (reference to FIG. 9b).

Figure 9C:
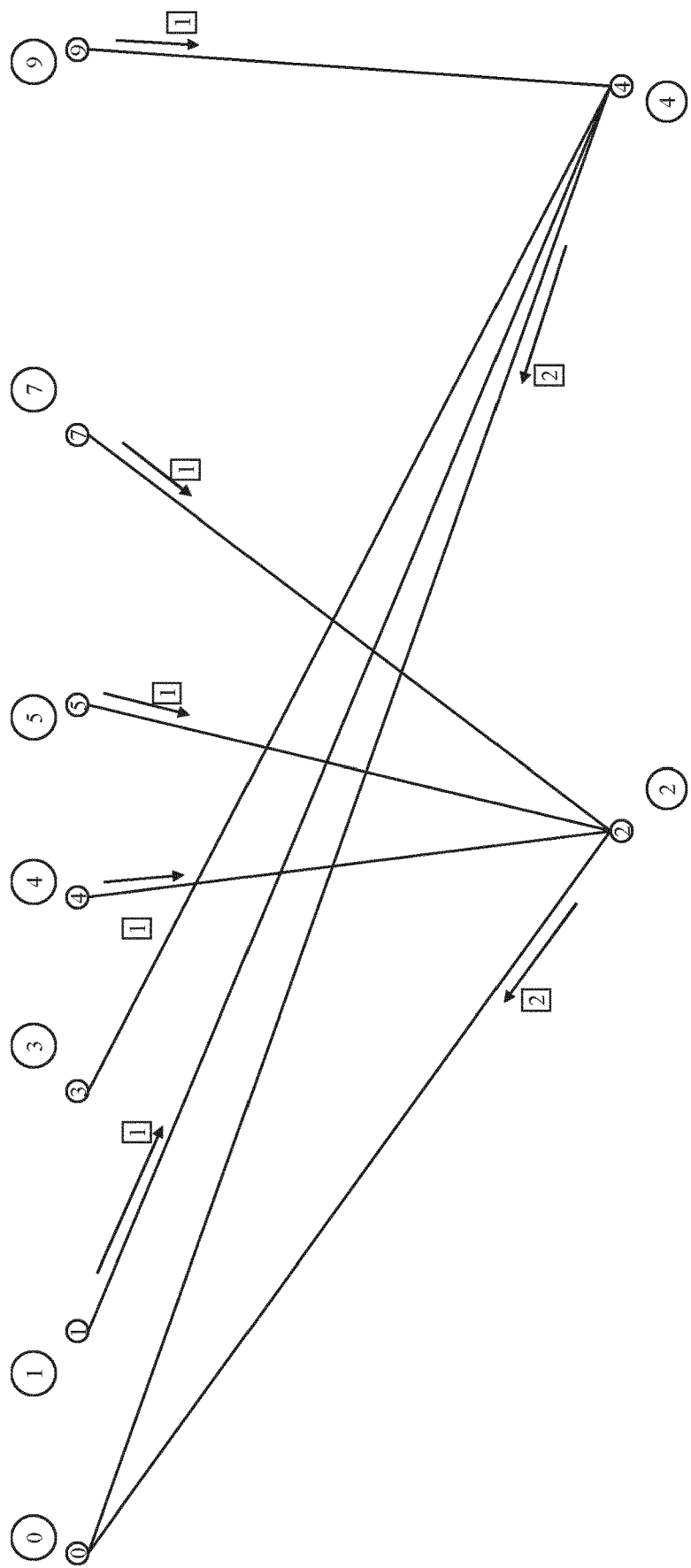
FIG. 9c is a schematic drawing illustrating an example base graph according to some embodiments.

In optional step 106b, in some embodiments, shared check-to-bit values are computed towards the shared bit based on the collected bit-to-check values (reference to FIG. 9c).

Figure 9D:
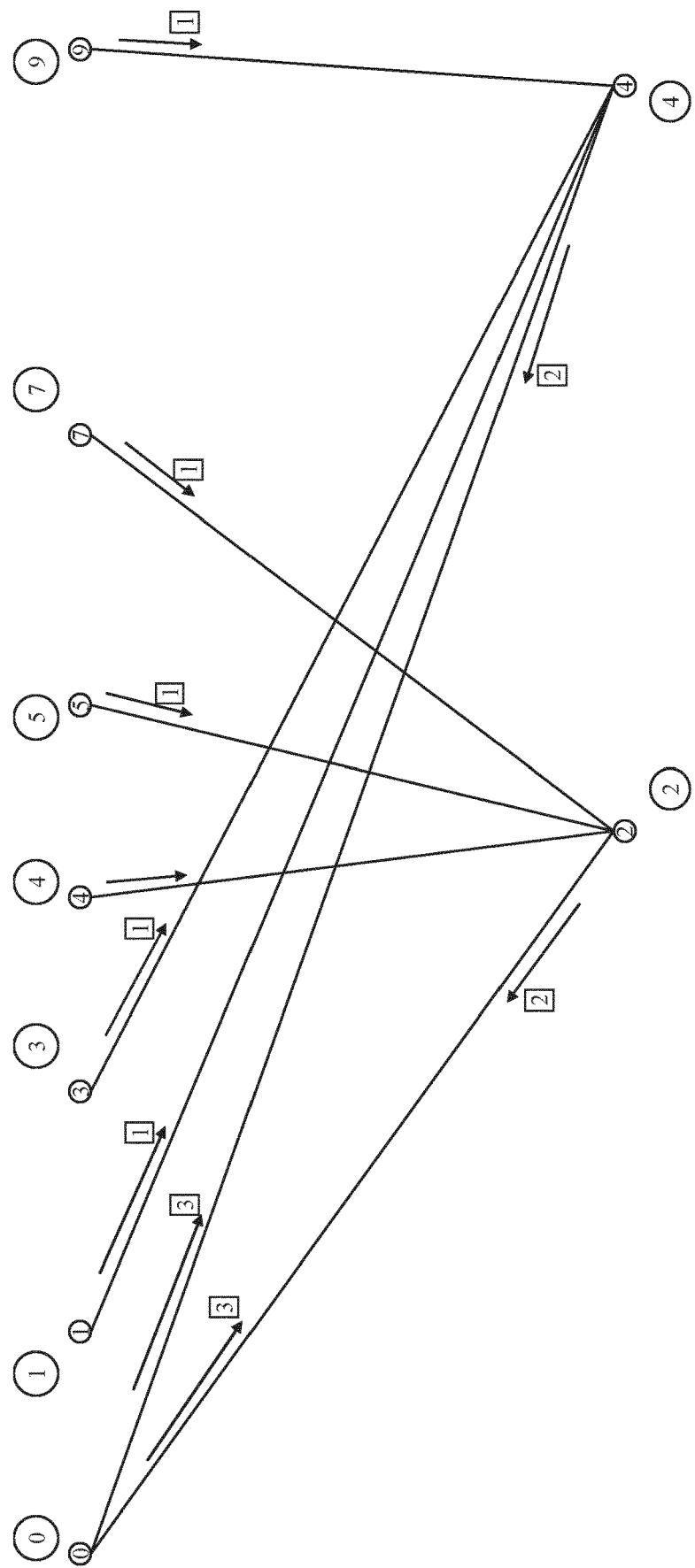
FIG. 9d is a schematic drawing illustrating an example base graph according to some embodiments.

In optional step 106c, in some embodiments, shared bit-to-check values are computed for the shared bit based on the computed shared check-to-bit values (reference to FIG. 9d).

Figure 9E:
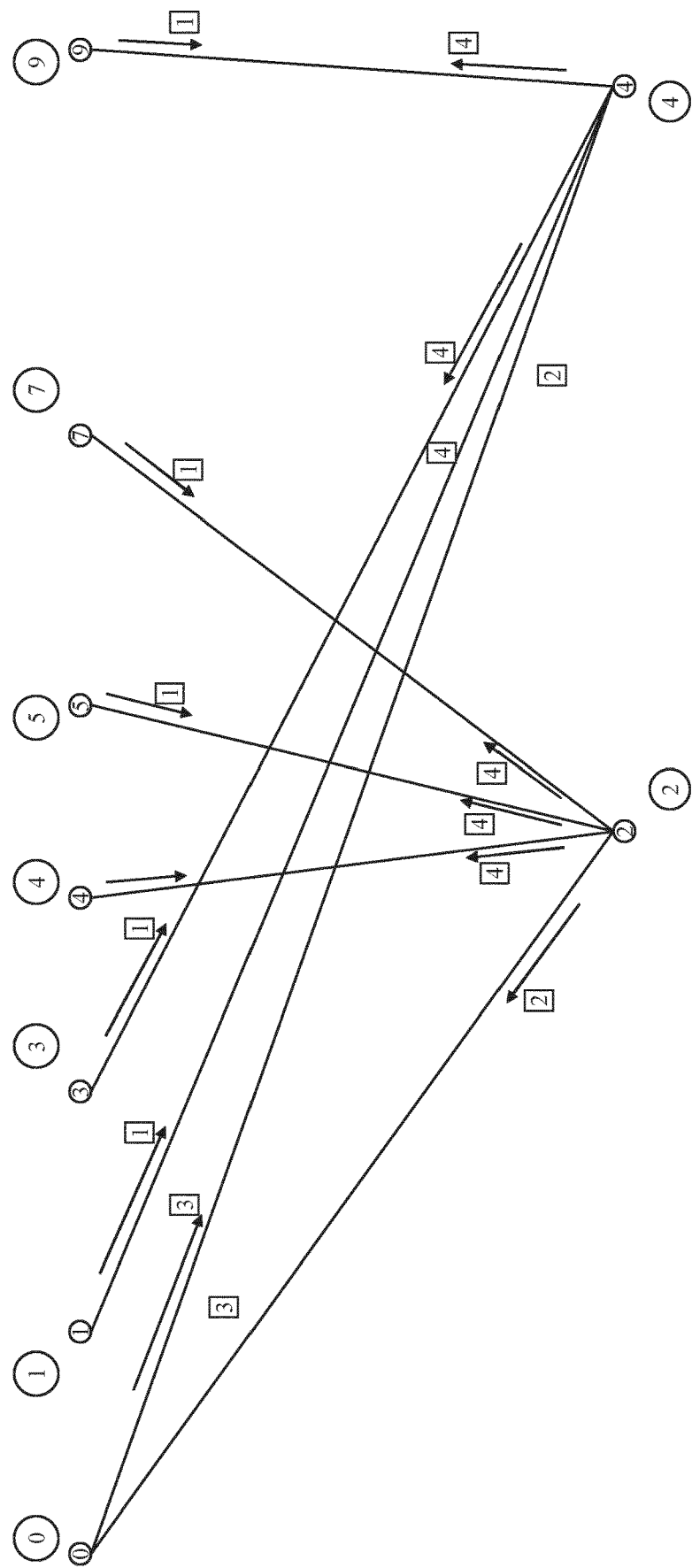
FIG. 9e is a schematic drawing illustrating an example base graph according to some embodiments.

In optional step 106d, in some embodiments, new check-to-bit values are computed for all remaining bits (reference to FIG. 9e).

In optional step 106e, in some embodiments, the parity checks of the row group for the received message are updated in parallel based on the computed check-to-bit values.

In step 107, a message estimate is formed based on the updated parity checks.

In some embodiments, the receiver is configured to iteratively update soft bit values associated with each code bit of the block code based on parallel parity checks.

In some embodiments, the soft bit values are indicative of corresponding message bits being either zero or one.

In some embodiments, a positive soft bit value is indicative of the corresponding message bit likely being a zero.

In some embodiments, a negative soft value is indicative of the corresponding message bit likely being a one.

In some embodiments, the parity-check matrix is pre-computed and stored in a memory of the receiver and/or in a remote memory accessible to the receiver.

For example, the remote memory may be comprised in a cloud environment.

In some embodiments, the parity-check matrix is a binary matrix.

Any of the above steps for FIG. 1 may additionally have features identical with or corresponding to any of the various features as explained below for FIGS. 2-11.

Figures 2A, 2B:
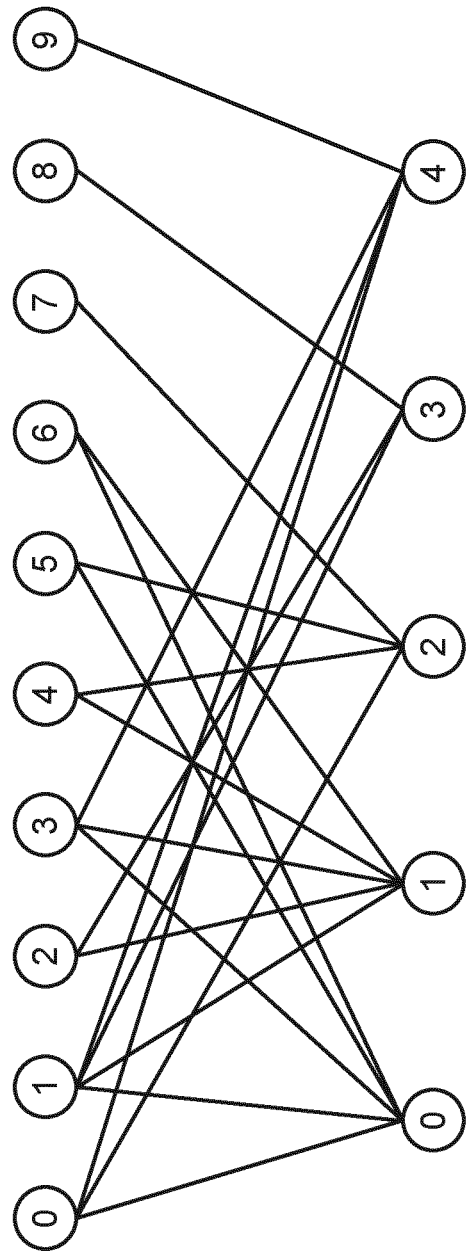
FIG. 2a is a schematic drawing illustrating an example base graph matrix according to some embodiments.
FIG. 2b is a schematic drawing illustrating an example base graph according to some embodiments.

FIG. 2a is a schematic drawing illustrating an example base graph matrix according to some embodiments.

As mentioned above, an LDPC code is defined by a binary matrix of size R×N, where R is the number of redundancy bits and N is the total number of bits in a code block.

In the 5G NR standard, N typically ranges from 28 bits to 26112 bits. Each matrix row represents a parity check that acts upon a subset of the code block bits and requires that these bits have even parity, i.e. that their modulo-2 sum is zero. The parity checks are defined by the location of the non-zero entries of a parity-check matrix (reference to FIG. 3b). The parity checks are relatively small, in that each involve a relatively small subset of the code block bits.

In the 5G NR standard, the parity-check sizes typically range from 3 to 19 bits. The construction of the base graph matrix also uses an integer Z that ranges from 2 to 384, which is used to form the parity-check matrix from the base graph matrix, as follows.

Each base graph matrix element is replaced by a Z-by-Z square binary matrix. For non-negative elements, the square matrix is a cyclically shifted identity matrix, where the number of shift steps equals the integer element. Otherwise the square matrix is zero. Each block of Z adjacent rows or columns corresponding to these square matrices is called a row block or column block, respectively. This construction ensures that none of the Z rows in the same row block involve any common bits.

The size of the 5G NR LDPC base graph matrix is variable. One construction starts out from a 4-by-26 matrix, and allows extension of this matrix by adding one row and one column at a time, up to a size of 46-by-68.

The base graph matrix of FIG. 2a corresponds to the base graph of FIG. 2b.

Alternatively or additionally, the base graph may comprise a protograph.

FIG. 2b is a schematic drawing illustrating an example base graph according to some embodiments.

In 5G NR LDPC codes, the parity-check matrix is designed using a so-called base graph with an associated base graph matrix (reference to FIG. 2a). Each row and each column of the base graph matrix correspond to a graph vertex. Thus, there are column vertices and row vertices.

Graph edges only exist between column and row vertices, and each edge corresponds to a non-negative integer element in the base graph matrix (reference to FIG. 2a). Other matrix elements are empty (sometimes represented as −1), meaning that that row and column are not connected in the graph.

Alternatively or additionally, the Z-variable represents a so called lifting size comprising a number of attached copies of the base graph and permuting edges of the base graph.

Figures 3A, 3B:
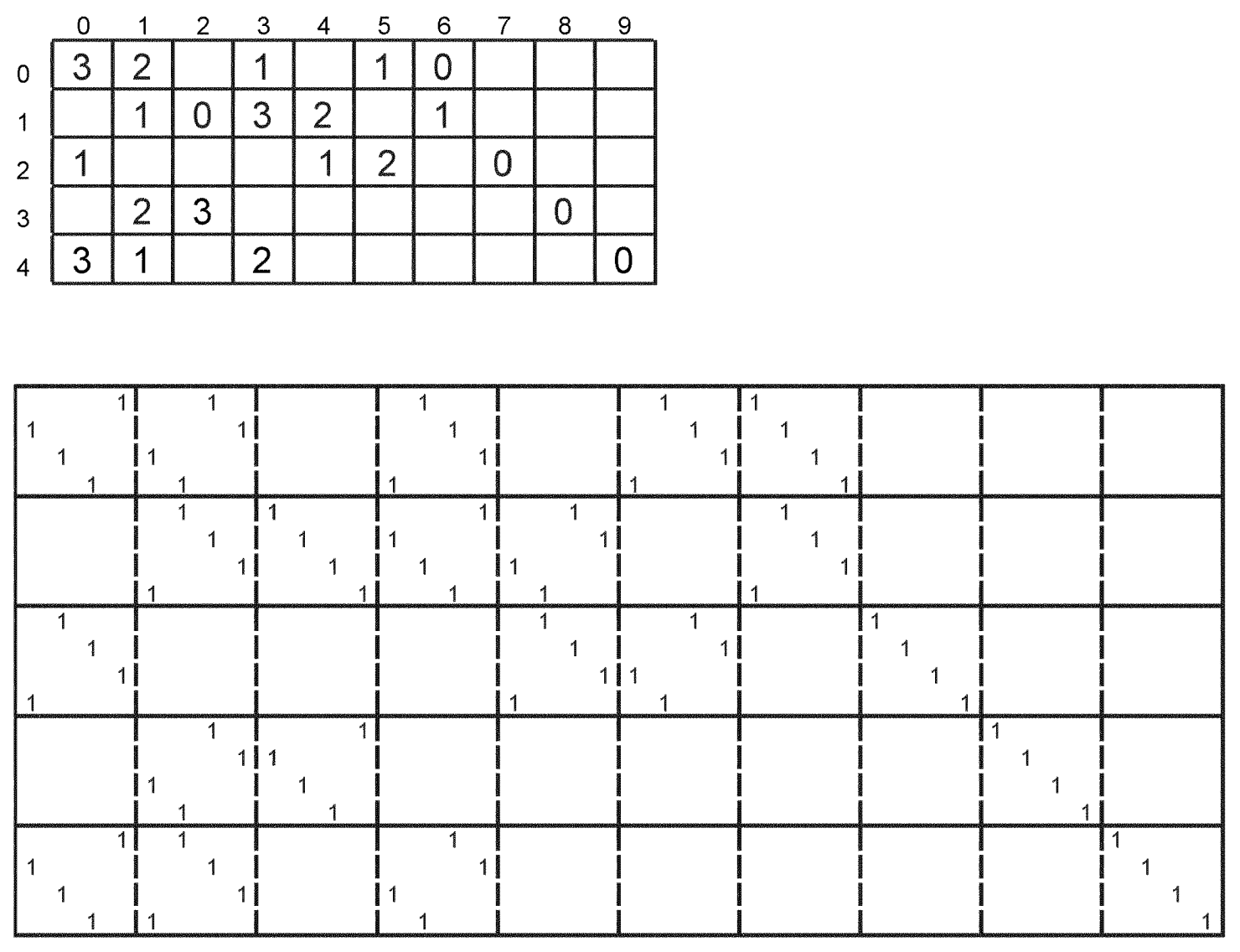

FIG. 3a is a schematic drawing illustrating an example base graph matrix according to some embodiments.

The construction of the base graph matrix also uses an integer Z that ranges from 2 to 384, which is used to form the parity-check matrix from the base graph matrix, as follows.

Each base graph matrix element is replaced by a Z-by-Z square binary matrix. For non-negative elements, the square matrix is a cyclically shifted identity matrix, where the number of shift steps equals the integer element. Otherwise the square matrix is zero. Each block of Z adjacent rows or columns corresponding to these square matrices is called a row block or column block, respectively. This construction ensures that none of the Z rows in the same row block involve any common bits.

The size of the 5G NR LDPC base graph matrix is variable. One construction starts out from a 4-by-26 matrix, and allows extension of this matrix by adding one row and one column at a time, up to a size of 46-by-68.

FIG. 3b is a schematic drawing illustrating an example parity-check matrix according to some embodiments.

The parity-check matrix of FIG. 3b corresponds to the base graph matrix of FIG. 3a and has a Z-variable set to 4.

When a code block is received after being transmitted over a radio channel, the code block bits are usually represented by numerical soft values: a positive soft value indicates that the corresponding bit is likely a zero, while a negative soft value indicates that the corresponding bit is likely a one.

It is the task of a LDPC decoder to process the received information and try and estimate the transmitted bits. The received information is usually represented by numerical "soft values" corresponding to the code block bits: a positive soft value indicates that the corresponding bit is likely a zero, while a negative soft value indicates that the corresponding bit is likely a one.

The LDPC decoder operates by iteratively updating soft information based on the parity checks.

Figure 3C:
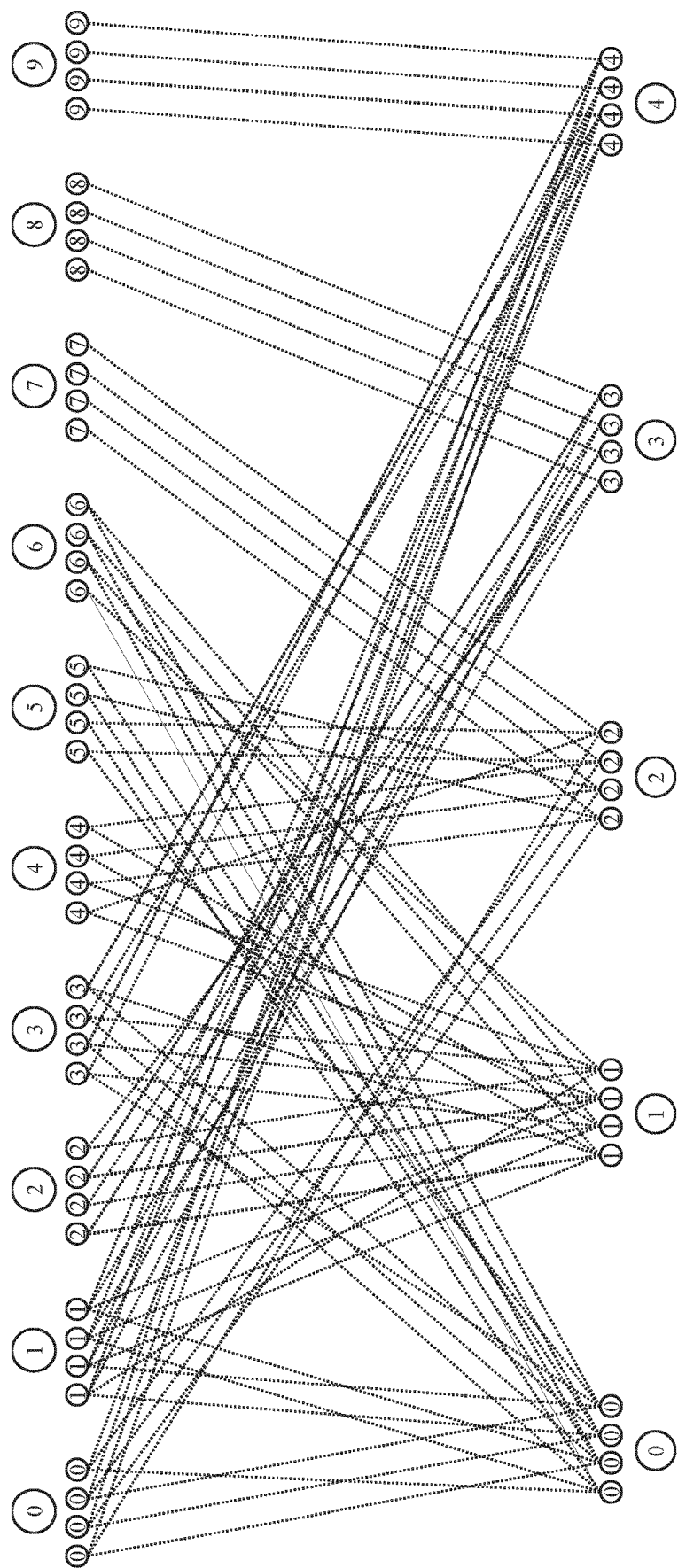
FIG. 3c is a schematic drawing illustrating an example base graph according to some embodiments.

FIG. 3c is a schematic drawing illustrating an example base graph according to some embodiments.

The base graph of FIG. 3c corresponds to the base graph matrix of FIG. 3a and illustrates iterative updating of soft information according to the parity-check matrix of FIG. 3b.

The soft information involves the soft bit values associated with each code block bit, as well as soft values associated with the edges in the graph, i.e. ones in the parity-check matrix.

The latter are denoted bit-to-check values and check-to-bit values. This updating proceeds for a number of iterations, after which a code block estimate is formed by examining the signs of the updated soft values (reference to step 107 of FIG. 1). The number of required iterations depends partly on the noisiness of the radio channel.

For example, when there is very little noise, it may be sufficient to perform a single update, while more noise channels may require as many as 30-40 iterations over all parity checks.

Figure 4A:
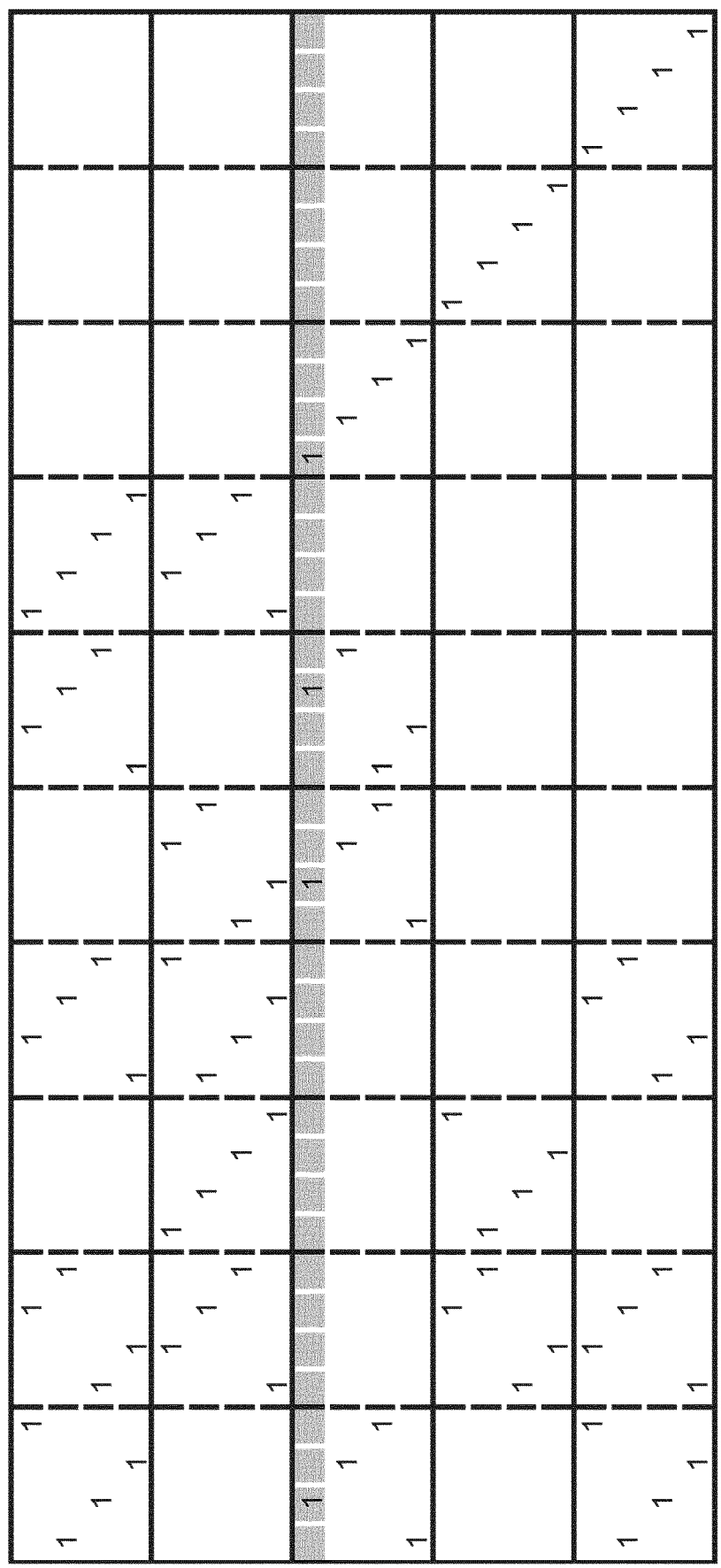
FIG. 4a is a schematic drawing illustrating an example parity-check matrix according to some embodiments.

FIG. 4a is a schematic drawing illustrating an example parity-check matrix according to some embodiments.

The parity-check matrix of FIG. 4a has a Z-variable set to 4.

The LDPC decoder operates by updating soft information based on one parity check, i.e. one row (emphasis added in matrix).

Figure 4B:
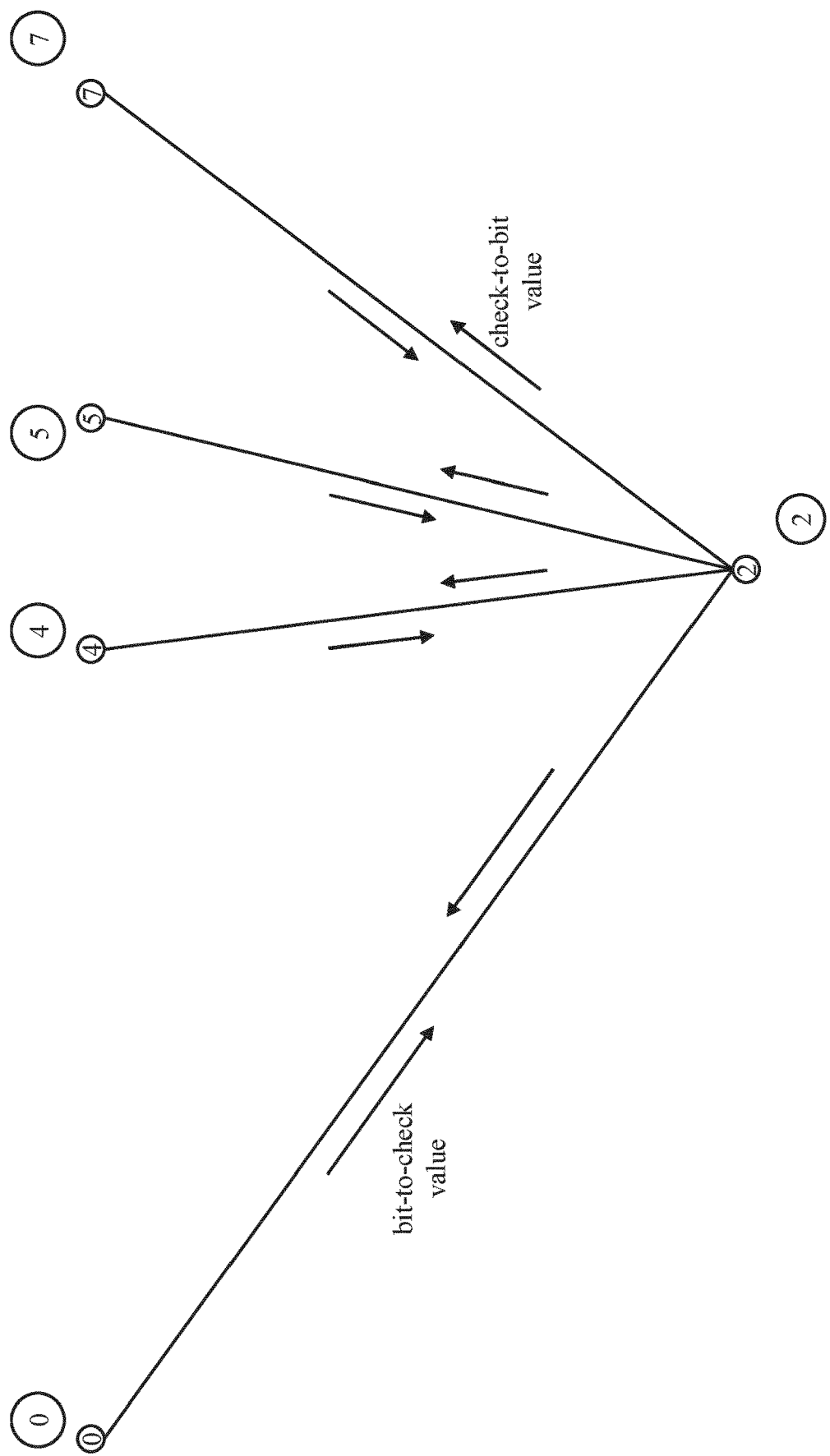
FIG. 4b is a schematic drawing illustrating an example base graph according to some embodiments.

FIG. 4b is a schematic drawing illustrating an example base graph according to some embodiments.

The base graph of FIG. 4b illustrates iterative updating of soft information according to the parity-check matrix of FIG. 4a.

The one parity-check update performed by the LDPC decoder comprises computing new check-to-bit values and new bit values.

In a first step, bit-to-check values are computed based on current bit values and check-to-bit values. This may be performed by subtracting the most recent check-to-bit values from the bit values, but other techniques may also be used.

In the next step, the update then computes new check-to-bit values based on the bit-to-check values.

Finally, new bit values are computed (not shown).

Different strategies exist for the order of updating the parity checks. One is to process one row of the parity-check matrix at a time, e.g. from top to bottom. An alternative is to process all rows in parallel, thereby trading processing time for hardware size.

Figure 5A:
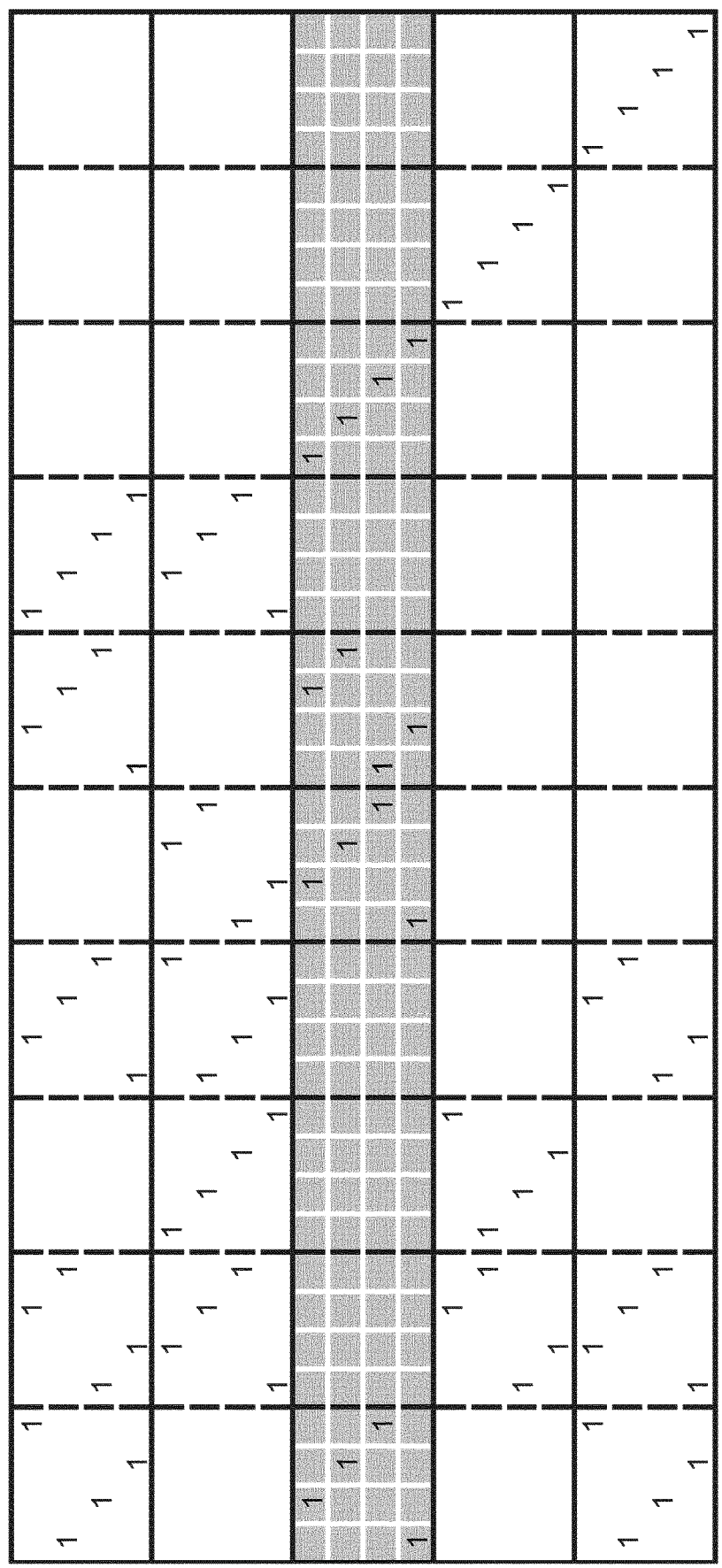
FIG. 5a is a schematic drawing illustrating an example parity-check matrix according to some embodiments.

FIG. 5a is a schematic drawing illustrating an example parity-check matrix according to some embodiments.

The parity-check matrix of FIG. 5a has a Z-variable set to 4.

The LDPC decoder operates by updating all checks, i.e. parity checks, in one row block (emphasis added in matrix).

This fully parallel approach entails that many row updates will update the soft bit values for the same bits. This may require expensive synchronization methods to avoid race conditions. Moreover, this may require more iterations to be performed, since the row updates that are performed in parallel are unable to use the updated soft values from each other.

The structure of the 5G NR LDPC codes allows for an update strategy that is called layered updating. With this strategy, the row blocks are processed sequentially, one by one, e.g. from top to bottom. However, for each row block, the Z constituent rows are updated in parallel.

This may be done without requiring expensive synchronization methods since the Z rows in a row block do not have any overlaps. This therefore allows for a parallelization speedup factor of Z, which can be as high as 384 for 5G NR LDPC codes.

The layered strategy typically requires that the row blocks be processed sequentially, which can mean up to 46 sequential steps for some 5G NR codes. This may create unwanted processing delays.

For example, when proceeding from one row block to the next, it may be necessary to synchronize and exchange information between different processing elements, a process that is often relatively slow compared to having the processing elements operate independently.

Hardware comprising parallel processing units may provide very high degree of parallelization, e.g. Graphics Processing Units (GPU). To implement LDPC decoding on such hardware comprising parallel processing units may enable even higher parallelization factors than can be obtained with the layered strategy.

Figure 5B:
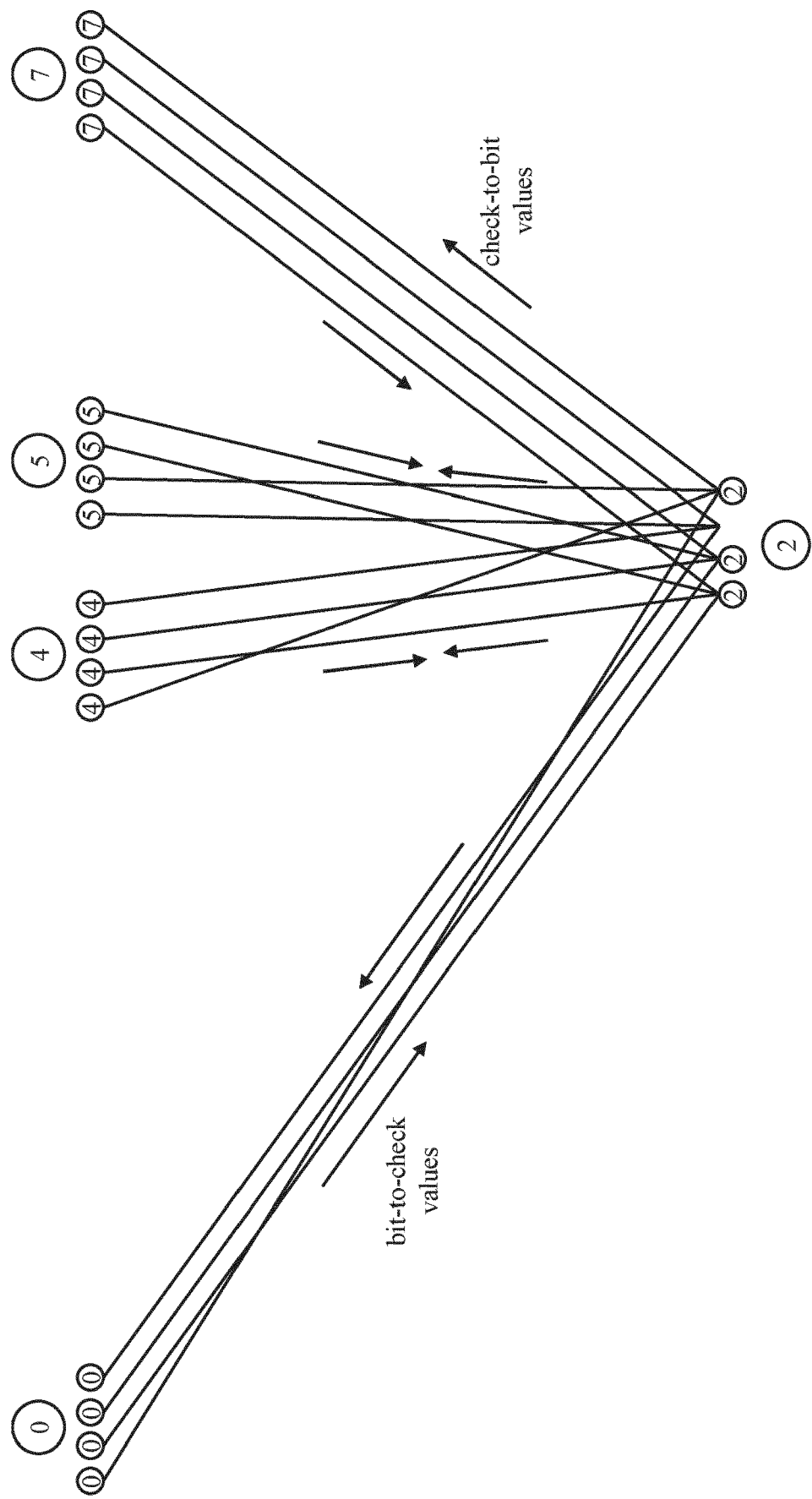
FIG. 5b is a schematic drawing illustrating an example base graph according to some embodiments.

FIG. 5b is a schematic drawing illustrating an example base graph according to some embodiments.

The base graph of FIG. 5b illustrates iterative updating of soft information according to the parity-check matrix of FIG. 5a.

The updating of all checks, i.e. parity-checks, in one row block by the LDPC decoder comprises computing new check-to-bit values and new bit values.

FIG. 6a is a schematic drawing illustrating an example parity-check matrix according to some embodiments.

The parity-check matrix of FIG. 6a has a Z-variable set to 4.

The LDPC decoder operates by updating all checks in two row blocks (emphasis added in matrix).

For example, combining row blocks may be performed when two rows of the base graph matrix are completely non-overlapping, i.e. they do not share any column with a nonnegative value. Such a row pair can be readily combined into a row group.

FIG. 6b is a schematic drawing illustrating an example base graph according to some embodiments.

The base graph of FIG. 6b illustrates iterative updating of soft information according to the parity-check matrix of FIG. 6a.

The updating of all checks, i.e. parity-checks, in two independent row blocks by the LDPC decoder comprises updating the parity checks for a combined row group comprising the two independent row blocks which are completely non-overlapping (reference to FIG. 6a).

FIG. 7a is a schematic drawing illustrating an example parity-check matrix according to some embodiments.

The parity-check matrix of FIG. 7a has a Z-variable set to 4.

The LDPC decoder operates by updating all checks in two row blocks with a shared column (emphasis added in matrix).

For example, when two or more rows of the base graph matrix overlap in a single column, they can be combined into a row group and be updated together using steps described in FIGS. 9b-9e.

FIG. 7b is a schematic drawing illustrating an example base graph according to some embodiments.

The base graph of FIG. 7b illustrates iterative updating of soft information according to the parity-check matrix of FIG. 7a.

The updating of all checks, i.e. parity-checks, in two row blocks with a shared column by the LDPC decoder comprises updating the parity checks for a combined row group comprising the two row blocks with the shared column (emphasis added to the overlap in the single column bits).

FIG. 8a is a schematic drawing illustrating an example parity-check matrix according to some embodiments.

The parity-check matrix of FIG. 8a has a Z-variable set to 4.

The LDPC decoder operates by updating all checks in two row blocks with a shared column (emphasis added in matrix).

For example, when two or more rows of the base graph matrix overlap in a single column, they can be combined into a row group and be updated together using steps described in FIGS. 9b-9e.

FIG. 8b is a schematic drawing illustrating an example base graph according to some embodiments.

The base graph of FIG. 8b illustrates iterative updating of soft information according to the parity-check matrix of FIG. 8a.

The updating of all checks, i.e. parity-checks, in two row blocks with a shared column by the LDPC decoder comprises updating the parity checks for a combined row group comprising the two row blocks with the shared column (emphasis added to the overlap in the single column bits).

FIG. 9a is a schematic drawing illustrating an example parity-check matrix according to some embodiments.

The parity-check matrix of FIG. 9a has a Z-variable set to 4.

The LDPC decoder operates by updating all checks in two row blocks with a shared column (emphasis added in matrix).

For example, when two or more rows of the base graph matrix overlap in a single column, they can be combined into a row group and be updated together using steps described in FIGS. 9b-9e.

More specifically, the base graph matrix illustrates an embodiment wherein row blocks 2 and 4 share column 0.

In following FIGS. 9b-9e, steps 1-4 (corresponding to steps 106a-106d of FIG. 1) in the updating with focus on one of the parity checks of row block 2 and one of the parity checks of row block 4, chosen such that they involve the same bit in the shared column 0.

FIG. 9b is a schematic drawing illustrating an example base graph according to some embodiments.

The base graph of FIG. 9b illustrates a first step of iterative updating of soft information according to the parity-check matrix of FIG. 9a.

Although, FIGS. 9b-9e only illustrate one parity check on each row block, the actual updating takes place over all of the parity checks in parallel.

Step 1: Collect available bit-to-check values.

In above step 1, latest bit-to-check values are collected, except for those coming from the shared bit.

FIG. 9c is a schematic drawing illustrating an example base graph according to some embodiments.

The base graph of FIG. 9c illustrates a first and second step of iterative updating of soft information according to the parity-check matrix of FIG. 9a.

Although, FIGS. 9b-9e only illustrate one parity check on each row block, the actual updating takes place over all of the parity checks in parallel.

Step 2: Compute shared check-to-bit values.

In above step 2, new check-to-bit values are computed towards the shared bit.

FIG. 9d is a schematic drawing illustrating an example base graph according to some embodiments.

The base graph of FIG. 9d illustrates a first, second, and third step of iterative updating of soft information according to the parity-check matrix of FIG. 9a.

Although, FIGS. 9b-9e only illustrate one parity check on each row block, the actual updating takes place over all of the parity checks in parallel.

Step 3: Compute shared bit-to-check values.

In above step 3, new bit-to-check values are computed for the shared bit, based on the previous step 2 illustrated in FIG. 9c.

FIG. 9e is a schematic drawing illustrating an example base graph according to some embodiments.

The base graph of FIG. 9e illustrates a first, second, third, and fourth step of iterative updating of soft information according to the parity-check matrix of FIG. 9a.

Although, FIGS. 9b-9e only illustrate one parity check on each row block, the actual updating takes place over all of the parity checks in parallel.

Step 4: Compute new check-to-bit values.

In above step 4, computation of the remaining check-to-bit values is performed, for all bits except the already computed shared bit.

In step 5 (not shown), the bit values for all involved are updated (corresponding to step 106e of FIG. 1).

Alternatively or additionally, when three or more base graph rows overlap in two different columns, such that only one of the rows have non-negative values in both of these columns, these rows can be combined into a row group and be updated together.

For example, for a given set of base graph rows, the condition that they can be combined into one update is based on a corresponding subgraph of the base graph. The subgraph consists of the given row vertices and the column vertices to which they are connected, as well as any edges defined by those rows. If this subgraph is free from cycles, then the rows can be combined into a group and updated in parallel.

Figure 10:
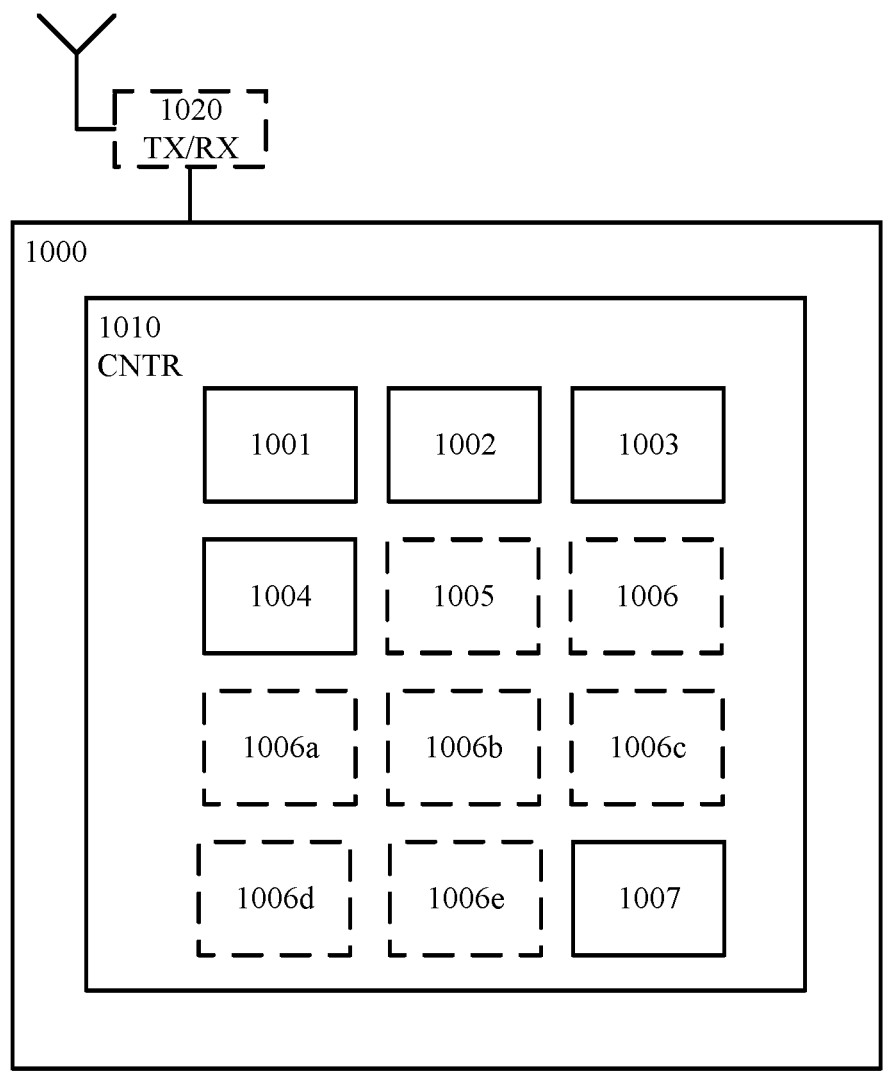
FIG. 10 is a schematic block diagram illustrating an example apparatus according to some embodiments.

FIG. 10 is a schematic block diagram illustrating an example apparatus 1000 according to some embodiments. The apparatus 1000 is for accelerating bit error correction in a receiver in a radio communication network. Thus, the apparatus 1000 and/or the controller 1010 may, for example, be configured to perform one or more of the method steps of FIG. 1, and/or updating steps of FIGS. 9b-9e, and/or one or more of any steps otherwise described herein.

The apparatus 1000 is for accelerating bit error correction in a receiver in a radio communication network, wherein the receiver is configured to update soft bit values associated with each code bit of a block code based on parallel parity checks.

The apparatus 1000 comprises a controller 1010, e.g. device controlling circuitry, configured to cause reception of a block code encoded message.

The controller 1010 is further configured to cause for any group of two or more rows of a parity-check matrix of the block code: when the two or more rows are non-overlapping: combination of the two or more rows in a row group for parallel updating, parallel update of the parity checks of the row group for the received message, and formation of a message estimate based on the updated parity checks.

In some embodiments, the controller 1010 is furthermore configured to cause, when the two or more rows are overlapping in one shared bit: combination of the two or more rows in a row group for parallel updating, update of the parity checks of the row group for the received message by: collection of available bit-to-check values except from the shared bit, computation of shared check-to-bit values towards the shared bit based on the collected bit-to-check values, computation of shared bit-to-check values for the shared bit based on the computed shared check-to-bit values, computation of new check-to-bit values for all remaining bits, and parallel update of the parity checks of the row group for the received message based on the computed check-to-bit values.

In some embodiments, the controller 1010 is furthermore configured to cause iterative updating of soft bit values associated with each code bit of the block code based on parallel parity checks.

The apparatus 1000 comprises, as mentioned above, the controller (CNTR; e.g., control circuitry or a controlling module) 1010, which may in turn comprise, (or be otherwise associated with; e.g., connected or connectable to), a receiver 1001, e.g. receiving circuitry or receiving module, configured to receive a block code encoded message (compare with step 101 of FIG. 1).

The controller 1010 further comprises, (or is otherwise associated with; e.g., connected or connectable to), a determiner 1002, e.g. determining circuitry or determining module, configured to determine, for any group of two or more rows of a parity-check matrix of the block code, when the two or more rows are non-overlapping (compare with step 102 of FIG. 1).

The controller 1010 furthermore comprises, (or is otherwise associated with; e.g., connected or connectable to), a combiner 1003, e.g. combining circuitry or combining module, configured to combine the two or more rows in a row group for parallel updating (compare with step 103 of FIG. 1), an updater 1004, e.g. updating circuitry or updating module, configured to update, in parallel, the parity checks of the row group for the received message (compare with step 104 of FIG. 1), and a former 1007, e.g. forming circuitry or forming module, configured to form a message estimate based on the updated parity checks (compare with step 107 of FIG. 1).

The controller 1010 may, in some embodiments, further comprise, (or be otherwise associated with; e.g., connected or connectable to), the determiner 1002, e.g. determining circuitry or determining module, configured to determine, for any group of two or more rows of a parity-check matrix of the block code, when the two or more rows are overlapping (102) in one shared bit (compare with step 102 of FIG. 1).

The controller 1010 may, in some embodiments, furthermore comprise, (or be otherwise associated with; e.g., connected or connectable to), a combiner 1005, e.g. combining circuitry or combining module configured to combine the two or more rows in a row group for parallel updating (compare with step 105 of FIG. 1), an updater 1006, e.g. updating circuitry or updating module, configured to update the parity checks of the row group for the received message (compare with step 106 of FIG. 1), a collector 1006a, e.g. collecting circuitry or collecting module, configured to collect available bit-to-check values except from the shared bit (compare with step 106a of FIG. 1), a computer 1006b, e.g. computing circuitry or computing module, configured to compute shared check-to-bit values towards the shared bit based on the collected bit-to-check values (compare with step 106b of FIG. 1), a computer 1006c, e.g. computing circuitry or computing module, configured to compute shared bit-to-check values for the shared bit based on the computed shared check-to-bit values (compare with step 106c of FIG. 1), a computer 1006d, e.g. computing circuitry or computing module, configured to compute new check-to-bit values for all remaining bits (compare with step 106d of FIG. 1), and an updater 1006e, e.g. updating circuitry or updating module, configured to update, in parallel, the parity checks of the row group for the received message based on the computed check-to-bit values (compare with step 106e of FIG. 1).

The controller 1010 may, in some embodiments, furthermore comprise, (or be otherwise associated with; e.g., connected or connectable to), an iterator (not shown), e.g. iterating circuitry or iterating module configured to iterate updating of soft bit values associated with each code bit of the block code based on parallel parity checks.

In some embodiments, the apparatus is operably connectable to general-purpose hardware with parallel processing elements configured to process the parallelized parity checks.

In some embodiments, each of the parallel processing elements is configured to compute respective one or more of shared check-to-bit values, shared bit-to-check values, and new check-to-bit values.

In some embodiments, the general-purpose hardware with parallel processing elements is comprised in the receiver and/or in a cloud environment.

In some embodiments, the general-purpose hardware comprises a Graphics Processing Unit, GPU.

The apparatus 1000 may further optionally comprise, (or be otherwise associated with; e.g., connected or connectable to), in some embodiments, a transceiver TX/RX 1020, e.g. transceiving circuitry or transceiving module, configured to transmit and receive radio signals e.g. in accordance with accelerating bit error correction in a receiver in a radio communication network.

Generally, when an apparatus is referred to herein, it is to be understood as a physical product. The physical product may comprise one or more parts, such as controlling circuitry in the form of one or more controllers, one or more processors, or the like.

The described embodiments and their equivalents may be realized in software or hardware or a combination thereof. The embodiments may be performed by general purpose circuitry. Examples of general purpose circuitry include digital signal processors (DSP), central processing units (CPU), Graphics Processing Units (GPU), co-processor units, field programmable gate arrays (FPGA) and other programmable hardware. Alternatively or additionally, the embodiments may be performed by specialized circuitry, such as application specific integrated circuits (ASIC). The general purpose circuitry and/or the specialized circuitry may, for example, be associated with or comprised in an apparatus such as a wireless communication device.

Embodiments may appear within an electronic apparatus (such as a wireless communication device) comprising arrangements, circuitry, and/or logic according to any of the embodiments described herein. Alternatively or additionally, an electronic apparatus (such as a wireless communication device) may be configured to perform methods according to any of the embodiments described herein.

According to some embodiments, a computer program product comprises a computer readable medium such as, for example a universal serial bus (USB) memory, a plug-in card, an embedded drive or a read only memory (ROM).

Figure 11:
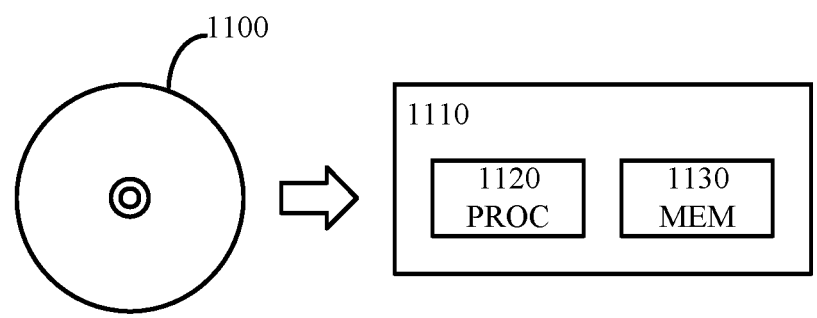
FIG. 11 is a schematic drawing illustrating an example computer readable medium according to some embodiments.

FIG. 11 illustrates an example computer readable medium in the form of a compact disc (CD) ROM 1100. The computer readable medium has stored thereon a computer program comprising program instructions. The computer program is loadable into a data processor (PROC) 1120, which may, for example, be comprised in a wireless communication device 1110. When loaded into the data processor, the computer program may be stored in a memory (MEM) 1130 associated with or comprised in the data processor.

In some embodiments, the computer program may, when loaded into and run by the data processing unit, cause execution of method steps according to, for example, FIG. 1 and/or FIGS. 9b-e and/or one or more of any steps otherwise described herein.

Generally, all terms used herein are to be interpreted according to their ordinary meaning in the relevant technical field, unless a different meaning is clearly given and/or is implied from the context in which it is used.

Reference has been made herein to various embodiments. However, a person skilled in the art would recognize numerous variations to the described embodiments that would still fall within the scope of the claims.

For example, the method embodiments described herein discloses example methods through steps being performed in a certain order. However, it is recognized that these sequences of events may take place in another order without departing from the scope of the claims. Furthermore, some method steps may be performed in parallel even though they have been described as being performed in sequence. Thus, the steps of any methods disclosed herein do not have to be performed in the exact order disclosed, unless a step is explicitly described as following or preceding another step and/or where it is implicit that a step must follow or precede another step.

In the same manner, it should be noted that in the description of embodiments, the partition of functional blocks into particular units is by no means intended as limiting. Contrarily, these partitions are merely examples. Functional blocks described herein as one unit may be split into two or more units. Furthermore, functional blocks described herein as being implemented as two or more units may be merged into fewer (e.g. a single) unit.

Any feature of any of the embodiments disclosed herein may be applied to any other embodiment, wherever suitable. Likewise, any advantage of any of the embodiments may apply to any other embodiments, and vice versa.

Hence, it should be understood that the details of the described embodiments are merely examples brought forward for illustrative purposes, and that all variations that fall within the scope of the claims are intended to be embraced therein.

The invention claimed is:

1. A method for accelerating bit error correction in a receiver in a radio communication network, the receiver being configured to update soft bit values associated with each code bit of a block code based on parallel parity checks, the method comprising:
receiving a block code encoded message; and
for any group of two or more rows of a parity-check matrix of the block code:
when the two or more rows are non-overlapping:
combining the two or more rows in a row group for parallel updating; and
updating, in parallel, the parity checks of the row group for the received message;
forming a message estimate based on the updated parity checks; and
when the two or more rows are overlapping in one shared bit:
combining the two or more rows in a row group for parallel updating; and
updating the parity checks of the row group for the received message by:
collecting available bit-to-check values except from the shared bit;
computing shared check-to-bit values towards the shared bit based on the collected bit-to-check values;
computing shared bit-to-check values for the shared bit based on the computed shared check-to-bit values;
computing new check-to-bit values for all remaining bits; and
updating, in parallel, the parity checks of the row group for the received message based on the computed check-to-bit values.

2. The method according to claim 1, wherein the receiver is configured to iteratively update soft bit values associated with each code bit of the block code based on parallel parity checks.

3. The method according to claim 2, wherein the soft bit values are indicative of corresponding message bits being either zero or one.

4. The method according to claim 1, wherein the soft bit values are indicative of corresponding message bits being either zero or one.

5. The method according to claim 1, wherein a positive soft bit value is indicative of the corresponding message bit likely being a zero.

6. The method according to claim 1, wherein a negative soft value is indicative of the corresponding message bit likely being a one.

7. The method according to claim 1, wherein the parity-check matrix is pre-computed and stored in a memory of the receiver and/or in a remote memory accessible to the receiver.

8. The method according to claim 1, wherein the parity-check matrix is a binary matrix.

9. A non-transitory computer readable storage medium, having thereon a computer program comprising program instructions, the computer program being loadable into a data processing unit and configured to perform a method for accelerating bit error correction in a receiver in a radio communication network, the receiver being configured to update soft bit values associated with each code bit of a block code based on parallel parity checks when the computer program is run by the data processing unit, the method comprising:
receiving a block code encoded message; and
for any group of two or more rows of a parity-check matrix of the block code:
when the two or more rows are non-overlapping:
combining the two or more rows in a row group for parallel updating;
updating, in parallel, the parity checks of the row group for the received message; and
forming a message estimate based on the updated parity checks; and
when the two or more rows are overlapping in one shared bit:
combining the two or more rows in a row group for parallel updating; and
updating the parity checks of the row group for the received message by:
collecting available bit-to-check values except from the shared bit;
computing shared check-to-bit values towards the shared bit based on the collected bit-to-check values;
computing shared bit-to-check values for the shared bit based on the computed shared check-to-bit values;
computing new check-to-bit values for all remaining bits; and
updating, in parallel, the parity checks of the row group for the received message based on the computed check-to-bit values.

10. An apparatus for accelerating bit error correction in a receiver in a radio communication network, the receiver being configured to update soft bit values associated with each code bit of a block code based on parallel parity checks, the apparatus comprising a controller configured to cause:
reception of a block code encoded message; and
for any group of two or more rows of a parity-check matrix of the block code:
when the two or more rows are non-overlapping:
combination of the two or more rows in a row group for parallel updating,
parallel updating of the parity checks of the row group for the received message;
formation of a message estimate based on the updated parity checks; and
when the two or more rows are overlapping in one shared bit:
combination of the two or more rows in a row group for parallel updating; and
updating of the parity checks of the row group for the received message by:
collecting available bit-to-check values except from the shared bit;
computing shared check-to-bit values towards the shared bit based on the collected bit-to-check values;

computing shared bit-to-check values for the shared bit based on the computed shared check-to-bit values;

computing new check-to-bit values for all remaining bits; and parallel updating of the parity checks of the row group for the received message based on the computed check-to-bit values.

11. The apparatus according to claim 10, wherein the receiver is configured to iteratively update soft bit values associated with each code bit of the block code based on parallel parity checks.

12. The apparatus according to claim 10, wherein the apparatus is operably connectable to general-purpose hardware with parallel processing elements configured to process the parallelized parity checks.

13. The apparatus according to claim 12, wherein the receiver is configured to iteratively update soft bit values associated with each code bit of the block code based on parallel parity checks.

14. The apparatus according to claim 10, wherein each of the parallel processing elements is configured to compute respective one or more of shared check-to-bit values, shared bit-to-check values, and new check-to-bit values.

15. The apparatus according to claim 10, wherein the general-purpose hardware with parallel processing elements is comprised in the receiver and/or in a cloud environment.

16. The apparatus according to claim 10, wherein the general-purpose hardware comprises a Graphics Processing Unit, GPU.

17. The apparatus according to claim 10, wherein the apparatus is comprised in a receiver in a radio communication.

18. The receiver according to claim 17, wherein the receiver is configured to update soft bit values associated with each code block bit of a code block based on parallel parity checks.

* * * * *